United States Patent
Imai et al.

(10) Patent No.: US 9,602,068 B2
(45) Date of Patent: Mar. 21, 2017

(54) HIGH-FREQUENCY POWER AMPLIFIER

(71) Applicant: Mitsubishi Electric Corporation, Tokyo (JP)

(72) Inventors: Shohei Imai, Tokyo (JP); Hiroshi Otsuka, Tokyo (JP); Koji Yamanaka, Tokyo (JP); Hiroaki Maehara, Tokyo (JP); Motoyoshi Koyanagi, Tokyo (JP); Akira Ota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/912,982

(22) PCT Filed: Apr. 8, 2014

(86) PCT No.: PCT/JP2014/060191
§ 371 (c)(1),
(2) Date: Feb. 19, 2016

(87) PCT Pub. No.: WO2015/029486
PCT Pub. Date: Mar. 5, 2015

(65) Prior Publication Data
US 2016/0211815 A1   Jul. 21, 2016

(30) Foreign Application Priority Data

Aug. 29, 2013   (JP) ................... 2013-177981

(51) Int. Cl.
*H03F 3/60*    (2006.01)
*H03F 1/56*    (2006.01)
(Continued)

(52) U.S. Cl.
CPC ............ *H03F 3/604* (2013.01); *H03F 1/565* (2013.01); *H03F 3/191* (2013.01); *H03F 3/193* (2013.01);
(Continued)

(58) Field of Classification Search
CPC ........................................................ H03F 3/60
(Continued)

(56) References Cited

U.S. PATENT DOCUMENTS 3,963,993 A * 6/1976 Hoffman ................ H03F 1/52
330/124 D
4,893,093 A * 1/1990 Cronauer ............... H03F 3/72
330/286
(Continued)

FOREIGN PATENT DOCUMENTS

JP   H06-334054 A   12/1994
JP   H07-263981 A   10/1995
(Continued)

OTHER PUBLICATIONS

International Search Report—PCT/JP2014/060191 mailed Jul. 1, 2014.

*Primary Examiner* — Patricia T Nguyen
(74) *Attorney, Agent, or Firm* — Studebaker & Brackett PC

(57) ABSTRACT

A configuration is provided with: a tuned line 13 that is connected between a branch terminal 3 and a branch terminal of branch lines 2 and 4; and a tuned line 14 that is connected between a combining terminal 7 and a combining terminal 9 of combining lines 10 and 11. This enables reduction of a non-uniform voltage distribution occurring due to a difference in characteristics between two amplifier elements 6 and 8.

3 Claims, 16 Drawing Sheets

(51) Int. Cl.
*H03F 3/191* (2006.01)
*H03F 3/193* (2006.01)
*H03F 3/24* (2006.01)
*H03F 3/68* (2006.01)

(52) U.S. Cl.
CPC .............. *H03F 3/245* (2013.01); *H03F 3/68* (2013.01); *H03F 2200/255* (2013.01); *H03F 2200/423* (2013.01); *H03F 2200/451* (2013.01); *H03F 2200/543* (2013.01)

(58) Field of Classification Search
USPC .............................. 330/286, 53, 124 R, 295
See application file for complete search history.

(56) References Cited

U.S. PATENT DOCUMENTS

| | | | |
|---|---|---|---|
| 5,282,072 A * | 1/1994 | Nazarathy | H04B 10/58 327/100 |
| 5,684,430 A | 11/1997 | Yamamoto | |
| 6,005,442 A | 12/1999 | Maeda et al. | |
| 2003/0057436 A1 | 3/2003 | Chaki | |
| 2010/0141339 A1* | 6/2010 | Day | H03F 1/3211 330/149 |
| 2010/0156537 A1* | 6/2010 | Dishop | H03F 3/211 330/276 |
| 2010/0308911 A1* | 12/2010 | Beaudin | H03H 9/542 330/185 |

FOREIGN PATENT DOCUMENTS

| | | |
|---|---|---|
| JP | H08-032376 A | 2/1996 |
| JP | H09-321509 A | 12/1997 |
| JP | H11-103205 A | 4/1999 |
| JP | 2001-257546 A | 9/2001 |
| JP | 2003-110381 A | 4/2003 |
| JP | 2006-270774 A | 10/2006 |

* cited by examiner (b). Fluctuations of Power Added Efficiency with Respect to Manufacturing Error x (a). Fluctuations of Output Power with Respect to Manufacturing Error x (a). Fluctuations of Output Power with Respect to Manufacturing Error x (b). Fluctuations of Power Added Efficiency with Respect to Manufacturing Error x

HIGH-FREQUENCY POWER AMPLIFIER

FIELD OF THE INVENTION

The present invention mainly relates to a high-frequency power amplifier for use in the VHF band, UHF band, microwave band, and millimeter-wave band.

BACKGROUND OF THE INVENTION

Patent Reference 1 as listed below discloses high-frequency power amplifier that is comprised of: a split line that splits an input signal into two and outputs two separate signals; a first. FET that amplifies one of the two separate signals output from the split line; a second FET that amplifies the other one output from the split line; and a combining line that combines the amplified separate signal obtained by the first FET and the amplified separate signal obtained by the second PET to output a combined signal including the two separate signals.

In the high-frequency power amplifier, in order to implement balanced operation of the two FETs, there are parallel circuits each having a capacitor and a resistor connected in parallel with each other, one parallel circuit being connected between an input terminal of the first BET and an input terminal of the second BET, and the other parallel circuit being connected between an output terminal of the first FET and an output terminal of the second BET.

RELATED ART DOCUMENT

Patent Reference

Patent Reference 1: Japanese Patent Application Publication No. 6-334054 A (paragraph [0006] and FIG. 1)

SUMMARY OF THE INVENTION

Problems to be Solved by the Invention

Since the conventional high-frequency power amplifier is configured in the above-described manner, when the operating frequency is high, it is difficult to obtain excellent characteristics of the capacitors, thus possibly causing the balanced operation of the two FETs not to be implemented. On the other hand, when the operating frequency is low, there is the problem that capacitors with a large capacitance need to be mounted. In addition, if the capacitors are mounted, there is another problem that an increase in mounting costs and so on occur.

The present invention is made to solve problems such as those described above, and an object of the present invention is to obtain a high-frequency power amplifier capable of reducing a non-uniform voltage distribution occurring due to the difference in characteristics between two amplifier elements, without mounting capacitors having excellent characteristics or capacitors with a large capacitance.

Means for Solving the Problem

In accordance with the present invention, there is provided a high-frequency power amplifier which includes: branch lines that split a signal input from an input terminal into two separate signals to output a separate signal being one of the two separate signals from a first branch terminal, and to output a separate signal being another one of the two separate signals from a second branch terminal; a first amplifier element that amplifies the separate signal output from the first branch terminal of the branch lines; a second amplifier element that amplifies the separate signal output from the second branch terminal of the branch lines; combining lines that combine the amplified separate signal obtained by the first amplifier element and the amplified ed separate signal obtained by the second amplifier element, thereby to output to an output terminal a combined signal including two separate signals; and one or more tuned lines being connected between at least one terminal pair of a pair of the first and second branch terminals of the branch lines and a pair of first and second combining terminals of the combining lines which receive the respective amplified separate signals obtained by the first and second amplifier elements, thereby to reduce a non-uniform voltage (distribution occurring between the at least one terminal pair.

Advantages of the Invention

According to the present invention, there is the configuration in which one or more tuned lines are connected between at least one terminal pair of a pair of the first and second branch terminals of the branch lines and a pair of the first and second combining terminals of the combining lines, thereby to reduce a non-uniform voltage distribution occurring between the at least one terminal pair. This achieves the effect that a non-uniform voltage distribution occurring due to the difference in characteristics between two amplifier elements can be reduced without mounting capacitors having excellent characteristics or capacitors with a large capacitance.

EMBODIMENTS OF THE INVENTION

To describe the present invention more specifically, embodiments for implementing the present invention will be described below with reference to the accompanying drawings.

First Embodiment

Figure 1:
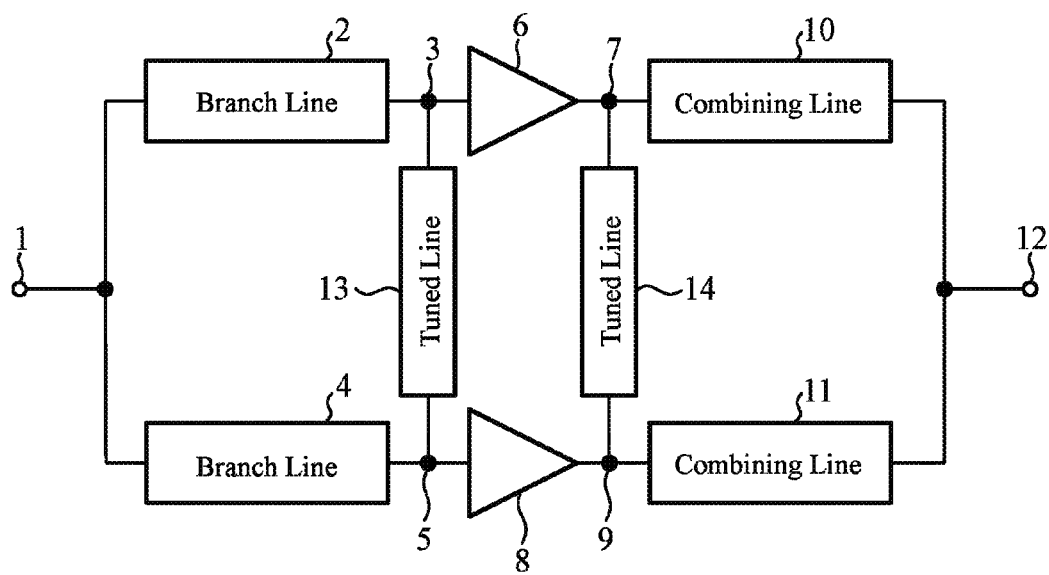
FIG. 1 is a configuration diagram showing a high-frequency power amplifier according to a first embodiment of the present invention.

FIG. 1 is a configuration diagram showing a high-frequency power amplifier according to a first embodiment of the present invention.

In FIG. 1, an input terminal 1 is a terminal that receives as an input a signal to be amplified.

A branch line 2 is a line connected at its one end to the input terminal 1 and connected at its other end to a branch terminal 3 (first branch terminal). The branch line 2 has an impedance $Z_{0i}$ and has a length of one-quarter wavelength ($=\lambda_0/4$) of a fundamental wave of the signal input from the input terminal 1.

A branch line 4 is a line connected at its one end to the input terminal 1 and connected at its other end to a branch terminal 5 (second branch terminal). The branch line 1 has an impedance $Z_{0i}$ and has a length of one-quarter wavelength ($=\lambda_0/4$) of the fundamental wave of the signal input from the input terminal 1.

Note that, since the impedances of the branch line 2 and the branch line 4 are $Z_{0i}$ and thus are the same, the signal input from the input terminal 1 is equally split into two separate signals. One separate signal is output to the branch terminal 3 and the other separate signal is output to the branch terminal Although in the example of FIG. 1 the branch line 2 and the branch line 4 are provided separately, the branch lines 2 and 4 may be formed of one line, and the input terminal 1 may be connected to an intermediate point of the one line.

An amplifier element 6 is comprised of, for example, an PET and so forth. The amplifier element 6 receives as an input the signal (separate signal) output to the branch terminal 3 from the branch line 2, amplifies the separate signal, and outputs the amplified separate signal to a combining terminal 7 (first combining terminal) Note that the amplifier element 6 constitutes a first amplifier element.

An amplifier element 8 is comprised of, for example, an PET and so forth. The amplifier element 8 receives as an input the signal (separate signal) output to the branch terminal 5 from the branch line 4, amplifies the separate signal, and outputs the amplified separate signal to a combining terminal 9 (second combining terminal). Note element 8 constitutes a second amplifier element.

A combining line 10 is a line connected at its one end to the combining terminal 7 and connected at its other end to an output terminal 12. The combining line 10 has an impedance $Z_{0o}$ and has a length of one-quarter wavelength ($=\lambda_0/4$) of the fundamental wave of the signal input from the input terminal 1.

A combining line 11 is a line connected at its one end to the combining terminal 9 and connected at its other end to the output terminal 12. The combining line 11 has an impedance $Z_{0o}$ and has a length of one-quarter ($=\lambda_0/4$) of the wavelength of the fundamental wave of the signal input from the input terminal.

The output terminal 12 is a terminal that outputs a combined signal of the signal output from the combining line 10 and the signal output from the combining line 11.

Although in the example of FIG. 1 the combining line 10 and the combining line 11 are provided separately, the combining lines 10 and 11 may be formed of one line, and the output terminal 12 may be connected to an intermediate point of the one line.

A tuned line 13 is connected between the branch terminal 3 and the branch terminal 5. The tuned line 13 has an impedance $Z_{0is}$ and has a length of one wavelength ($=\lambda_0$) of the fundamental wave of the signal input from the input terminal 1. Although here an example in which the tuned line 13 has a length of one wavelength ($=\lambda_0$) is described, the length of the tuned line 13 is not limited to one wavelength and may be n wavelengths (where n is a natural number).

A tuned line 14 is connected between the combining terminal 7 and the combining terminal 9. The tuned line 14 has an impedance $Z_{0os}$ and has a length of one wavelength ($=\lambda_0$) of the fundamental wave of the signal input from the input terminal 1. Although here an example in which the tuned line 14 has a length of one wavelength ($=\lambda_0$) is described, the length of the tuned line 14 is not limited to one wavelength and may be n wavelengths (where n is a natural number).

In the example of FIG. 1, both the tuned line 13 and the tuned line 14 are mounted. Nonetheless, at least one of the tuned line 13 and the tuned line 14 needs to be mounted, thereby enabling reduction of a non-uniform voltage distribution occurring due to the difference in characteristics between the amplifier element 6 and the amplifier element 8.

Figure 2:
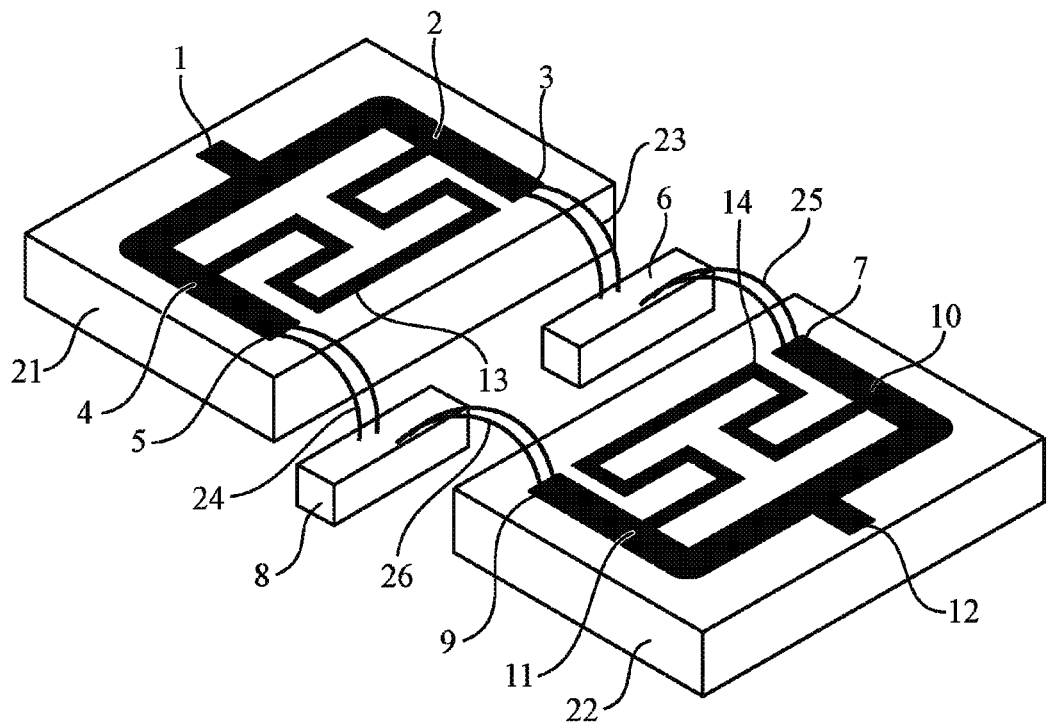
FIG. 2 is a schematic diagram showing an example of the high-frequency power amplifier according to the first embodiment of the present invention.

FIG. 2 is a schematic diagram showing an example of the high-frequency power amplifier according to the first embodiment of the present invention.

In the example of FIG. 2, an input terminal 1, branch lines 2 and 4, branch terminals 3 and 5, and a tuned line 13 are implemented on an dielectric substrate by a metal pattern, and the dielectric substrate 21 for a splitter on which the input terminal 1, the branch lines 2 and 4, the branch terminals 3 and 5, and the tuned line 13 are mounted is illustrated.

Further, combining terminals 7 and 9, combining lines 10 and 11, an output terminal 12 and a tuned line 14 are implemented on an dielectric substrate by a metal pattern, and the dielectric substrate 22 for a combiner on which the combining terminals 7 and 9, the combining lines 10 and 11, the output terminal 12 and the tuned line 14 are mounted is illustrated.

In addition, the dielectric substrate 21 for a splitter is connected to amplifier elements 6 and 8 by metal wires 23 and 24, and the amplifier elements 6 and 8 are connected to the dielectric substrate 22 for a combiner by metal wires 25 and 26.

In the example of FIG. 2, the branch line 2 and the branch line 4 are formed of one line, and the input terminal 1 is connected to an intermediate point, of the one line.

In addition, in the example of FIG. 2, the combining line 10 and the combining line 11 are formed of one line, and the output terminal 12 is connected to an intermediate point of the one line.

Note that, although FIG. 2 shows an example in which the tuned lines 13 and 14 are implemented by metal patterns on the dielectric substrates, a part of the tuned lines 13 and 14 may be implemented by a metal wire and so forth.

Figure 3:
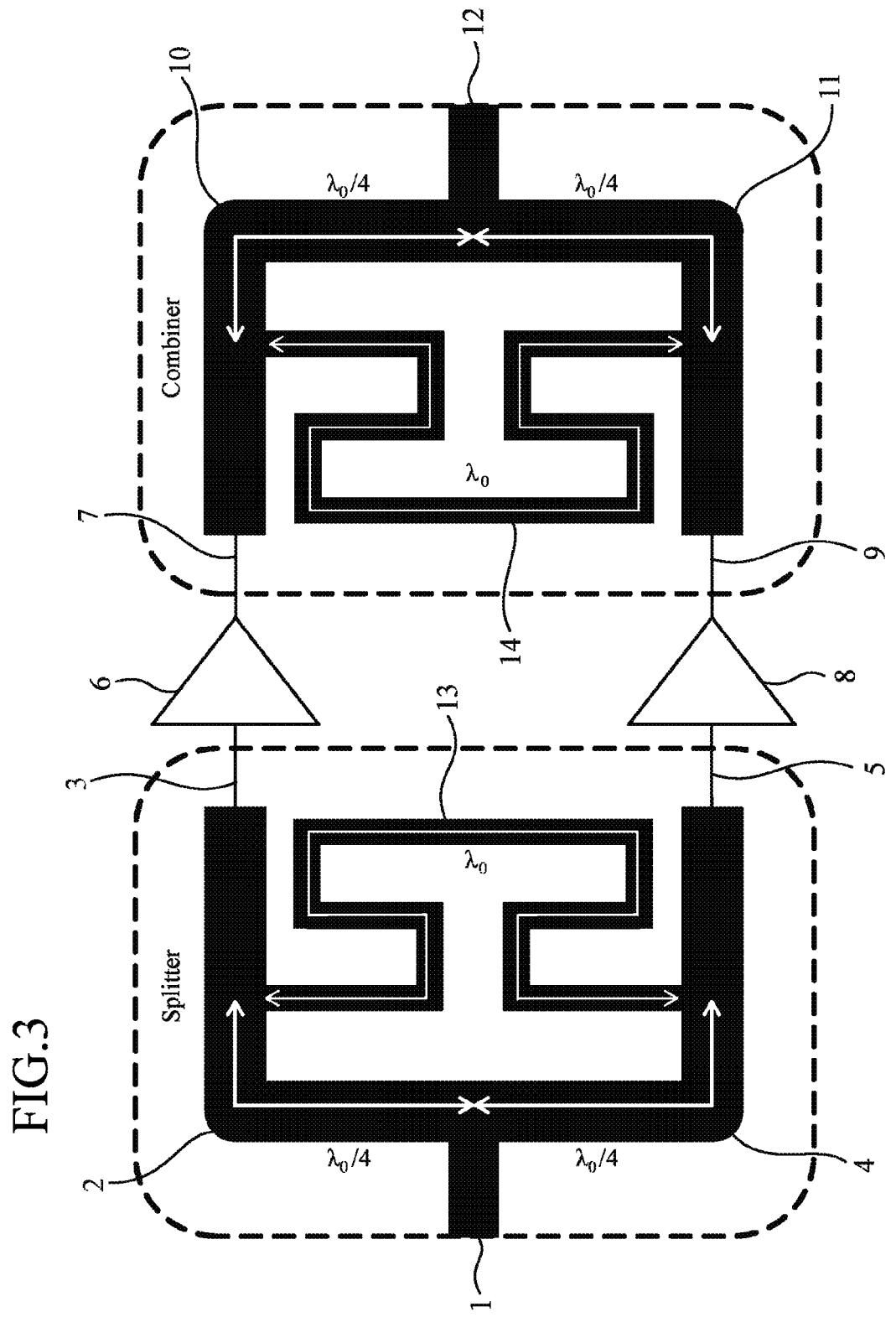
FIG. 3 is a schematic diagram showing a circuit pattern for a case in which the high-frequency power amplifier of FIG. 1 is implemented by microstrip lines of a metal pattern on a dielectric substrate.

FIG. 3 is a schematic diagram showing a circuit pattern for a case in which the high-frequency power amplifier of FIG. 1 is implemented by microstrip lines of a metal pattern on dielectric substrates.

As shown in FIG. 3, in considering circuit size constraints, parts of the branch lines 2 and 4 and/or combining lines 10 and 11 can be disposed so as to be perpendicular to an input terminal 1 and to a signal propagation direction.

In the high-frequency power amplifier disclosed in the above-described Patent Reference 1, in order to implement balanced operation of two FETs, parallel circuits each having a capacitor and a resistor connected in parallel with each other are connected. However, if parts of the branch lines 2 and 4 and/or combining lines 10 and 11 are disposed so as to be perpendicular to the input terminal 1 and to the signal propagation direction, a spatial distance between two connection points of each of the parallel circuits is large. Thus, in some cases, it may be difficult to connect the parallel circuits.

In contrast, in the first embodiment, since the tuned lines 13 and 14 each having a length of one wavelength ($=\lambda_0$) are connected, even if the two branch terminals 3 and 5 or the two combining terminals 7 and 9 are spatially away from each other, the tuned lines 13 and 14 can be easily connected.

Figure 4:
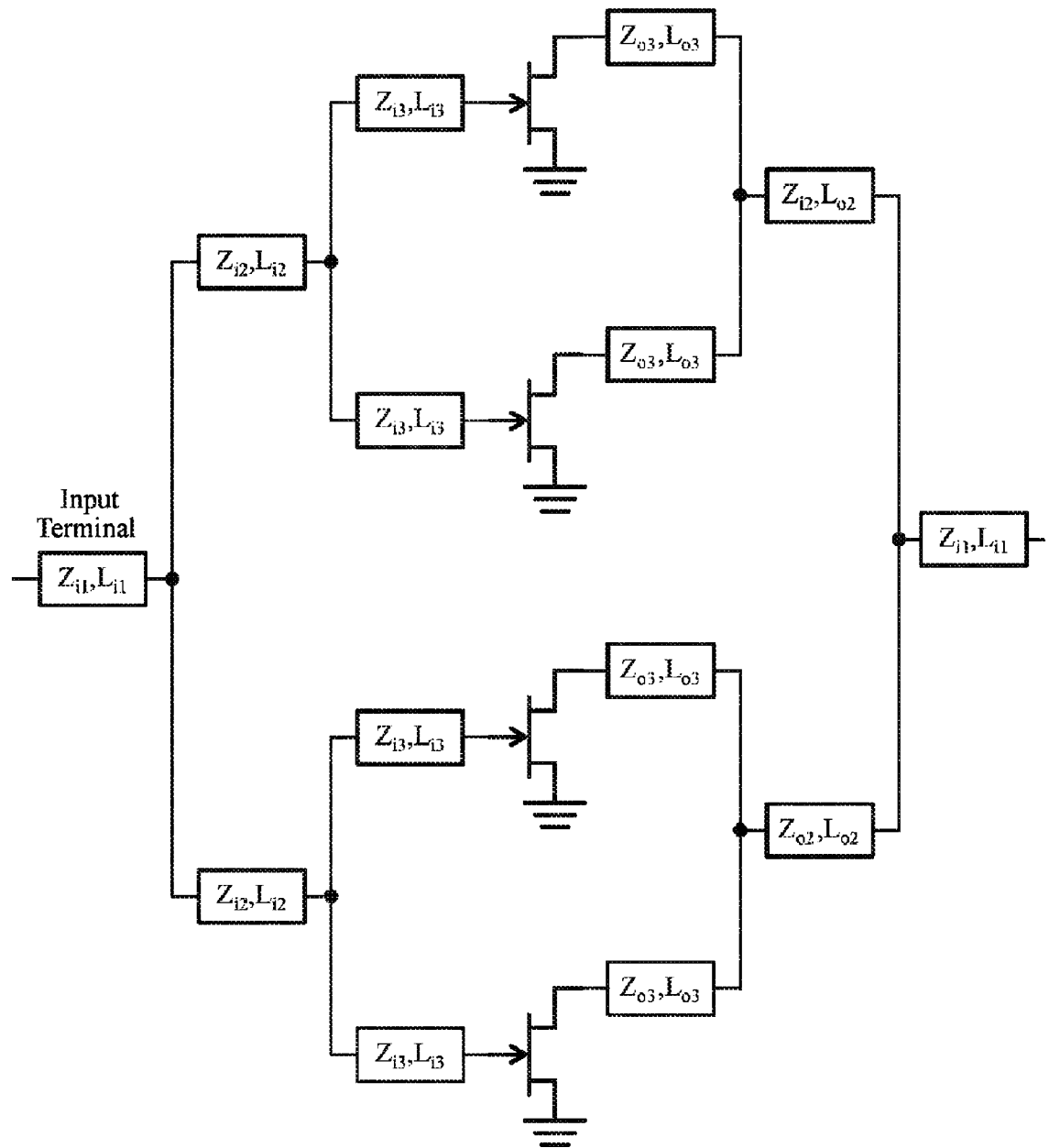
FIG. 4 is a configuration diagram showing amplifier elements of the high-frequency power amplifier according to the first embodiment of the present invention.

FIG. 4 is a configuration diagram showing the amplifier elements 6 and 8 of the high-frequency power amplifier according to the first embodiment of the present invention.

FIG. 4 shows an example of ¼-wavelength line splitters/combiners formed at two stages in which four field effect transistors are combined.

In this regard, note that the amplifier element 6 and the amplifier element 8 are not limited to the amplifier elements of the configuration of FIG. 4, and may be circuits that basically have amplification operations.

Next, an operation will be described.

A signal input from the input terminal 1 is split into two separate signals by the branch lines 2 and 4. One separate signal is output to the amplifier element 6, and the other separate signal is output to the amplifier element 8.

When the amplifier element 6 receives as an input the separate signal output from the branch line 2, the amplifier element 6 amplifies the separate signal and outputs the amplified separate signal to the combining line 10.

When the amplifier element 8 receives as an input the separate signal output from the branch line 1, the amplifier element 8 amplifies the separate signal and outputs the amplified separate signal to the combining line 11.

As a result, the separate signal obtained by the amplification of the amplifier element 6 and the separate signal obtained by the amplification of the amplifier element 8 are combined together by the combining lines 10 and 11, and the resulting combined signal is output to the output terminal 12.

In this regard, note that, if there is a difference in characteristics between the amplifier element 6 and the amplifier element 8, non-uniformity occurs in the input and/or output voltages between the amplifier element 6 and the amplifier element 8, thus causing the amplifier elements 6 and 8 to lose their original capability.

This non-uniform voltage distribution is caused by a component called an anti-phase mode voltage. If the anti-phase mode voltage can be canceled out, then the non-uniformity is reduced thereby to exhibit their original capability.

Since the high-frequency power amplifier including the branch lines and the combining lines is entirely designed to be an object with respect to the input terminal 1 and the output terminal 12 which are centered in the high-frequency power amplifier, the anti-phase mode voltage forms a standing wave having nodes at branch and combining points that are present on a centerline of the entire high-frequency power amplifier.

Since the node and an anti-node appear alternately to be spaced ¼ wavelength away from each other due to the property of the standing wave, there is the anti-node of the standing wave of the anti-phase mode voltage, appearing at the point spaced ¼ wavelength away from each of the branch point and combining point.

In addition, the two points which are spaced ¼ wavelength away from the branch point (or the combining point) along the two branch lines 2 and 4 (or combining lines 10 and 11) are two points that are spaced a total of ½ wavelength away from each other. Thus, at these two points, anti-phases in the standing wave of the anti-phase mode voltage appear. Therefore, a potential difference between the two points is the voltage that most reflects the standing wave of the anti-phase mode voltage.

On the other hand, a line having a length of one wavelength has the characteristic that the line has the same voltage at its both ends. A line having a length of n wavelengths also has the characteristic that the line has the same voltage at its both ends, similarly to the line having a length of one wavelength.

In the first embodiment, each of the tuned lines 13 and 14 is comprised of a line having a length of one wavelength, the tuned line 13 is connected between the two branch terminals 3 and 5, and the tuned line 14 is connected between the two combining terminals 7 and 9. This enables the tuned lines 13 and 14 to operate so as to reduce a potential difference, due to a standing wave of an anti-phase mode voltage, occurring between the two branch terminals 3 and 5 or between the two combining terminals 7 and 9. Therefore, the anti-phase mode voltage cannot be present.

As a result, even if there is a difference in characteristics between the amplifier element 6 and the amplifier element 8, the entire high-frequency power amplifier enables the amplifier elements 6 and 8 to exhibit their original capability.

Figure 5:
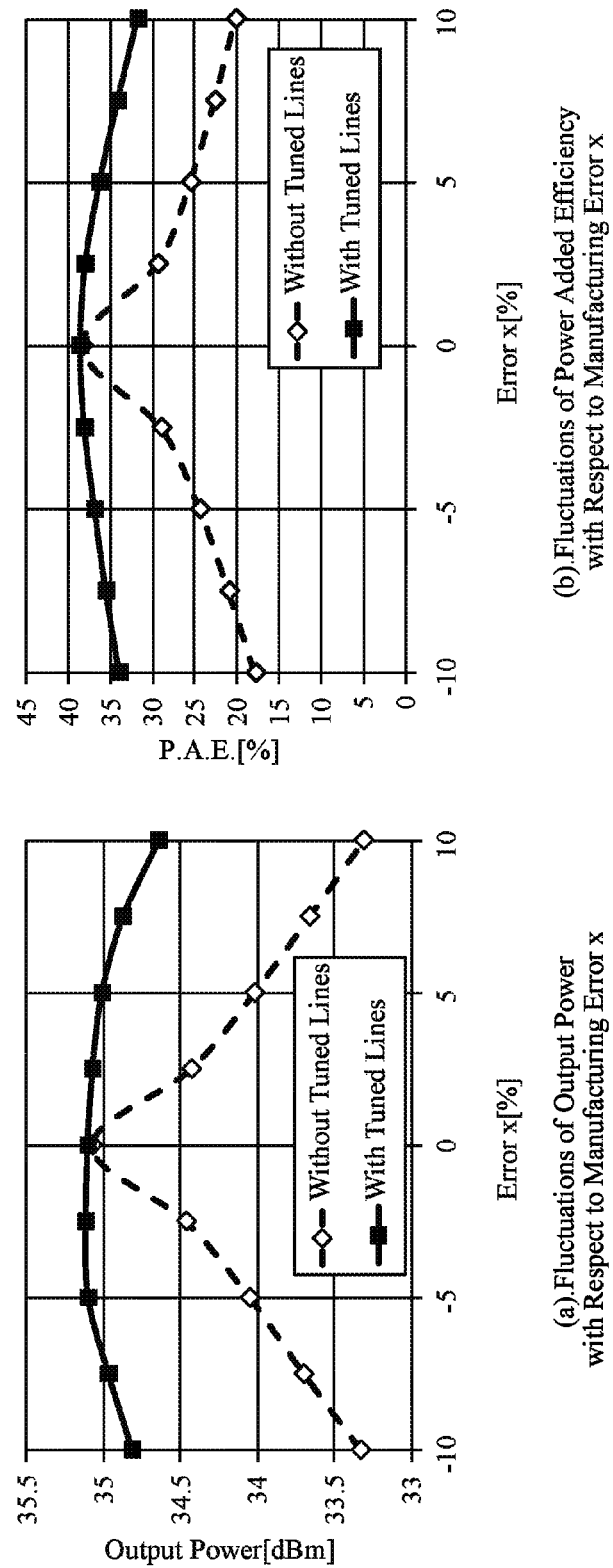
FIG. 5 illustrates diagrams showing characteristics of output power and power added efficiency with respect to a manufacturing error x of one amplifier element.

Here, FIG. 5 illustrates diagrams showing characteristics of output power and power added efficiency with respect to a manufacturing error x of one amplifier element.

Particularly, FIG. 5(*a*) shows fluctuations of output power with respect to the manufacturing error x, and FIG. 5(*b*) shows fluctuations of power added efficiency with respect to the manufacturing error x.

In FIG. 5, solid lines represent characteristics for a case with the tuned lines 13 and 14, and dashed lines represent characteristics for a case with no tuned lines 13 and 14.

In the case with no tuned lines 13 and 14, the characteristics change abruptly with respect to the manufacturing error x of one amplifier element. On the other hand, in the case with the tuned lines 13 and 14, even if there is some manufacturing error x, a reduction in the characteristics is small.

Therefore, even if an amplifier element's manufacturing error x with a certain probability distribution occurs, the yield of amplifier elements can be increased.

As is clear from the above descriptions, according to the first embodiment, it is configured such that the tuned line 13 is connected between the branch terminal 3 and branch terminal 5 of the branch lines 2 and 4 and the tuned line 14 is connected between the combining terminal 7 and combining terminal 9 of the combining lines 10 and 11, thereby achieving the effect that a non-uniform voltage distribution occurring due to the difference in characteristics between the two amplifier elements 6 and 8 can be reduced without mounting capacitors having excellent characteristics or capacitors with a large capacitance.

Second Embodiment

Figure 6:
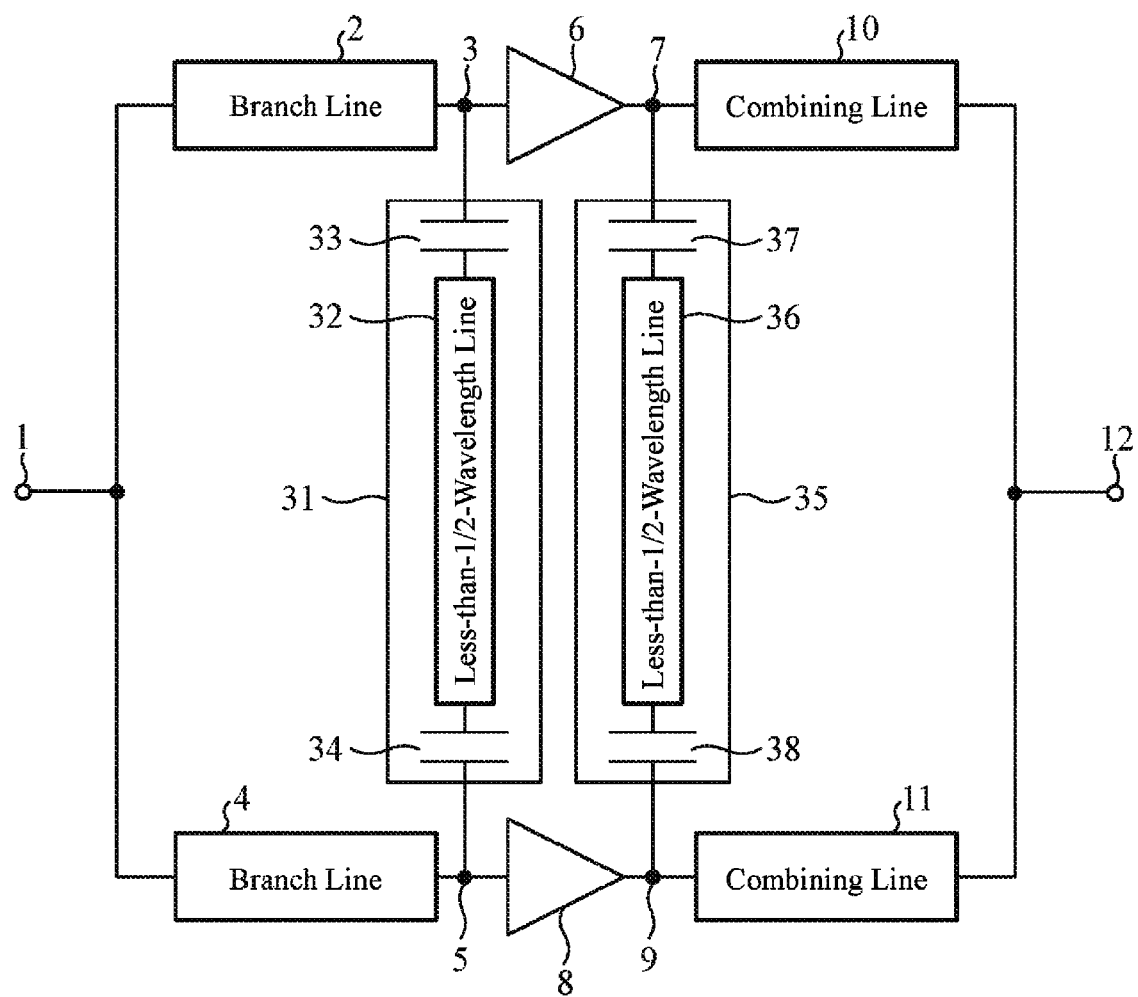
FIG. 6 is a configuration diagram showing a high-frequency power amplifier according to a second embodiment of the present invention.

FIG. 6 is a configuration diagram showing a high-frequency power amplifier according to a second embodiment of the present invention. In the drawing, the same reference numerals as those in FIG. 1 indicate the same or corresponding portions, and thus their descriptions are omitted.

A tuned line 31 is connected between a branch terminal 3 and a branch terminal 5, and is comprised of a series circuit having a less-than-½-wavelength line 32 and tuned capacitors 33 and 34 which are connected in series.

The less-than-½-wavelength line 32 has an impedance $Z_{0is}$ and has a line length shorter than one-half wavelength ($=\lambda_0/2$) of a fundamental wave of a signal input from an input terminal 1.

A tuned line 35 is connected between a combining terminal 7 and a combining terminal 9, and is comprised of a series circuit having a less-than-½-wavelength line 36 and tuned capacitors 37 and 38 which are connected in series, The less-than-½-wavelength line 36 has an impedance $Z_{0os}$ and has a line length shorter than one-half wavelength ($=\lambda_0/2$) of the fundamental wave of the signal input from the input terminal 1.

In the example of FIG. 6, both the tuned line 31 and the tuned line 35 are mounted. Nonetheless, at least one of the tuned line 31 and the tuned line 35 needs to be mounted, thereby enabling reduction of a non-uniform voltage distribution occurring due to the difference in characteristics between an amplifier element 6 and an amplifier element 8.

In the above-described first embodiment, it is described that the tuned lines 13 and 14 each having a length of one wavelength ($=\lambda_0$) of the fundamental wave are connected between the terminals. Instead of the tuned lines 13 and 14, the tuned line 31 having the less-than-½-wavelength line 32 and the tuned capacitors 33 and 34 which are connected in series can be connected between the terminals, and the tuned line 35 having the less-than-½-wavelength line 36 and the tuned capacitors 37 and 38 which are connected in series can be connected between the terminals.

In this regard, it is most effective that the series circuit having the less-than-½-wavelength line 32 (the less-than-½-wavelength line 36) and the tuned capacitors 33 and 34 (the tuned capacitors 37 and 38) which are connected in series be selected so as to resonate with the fundamental wave.

Figure 7:
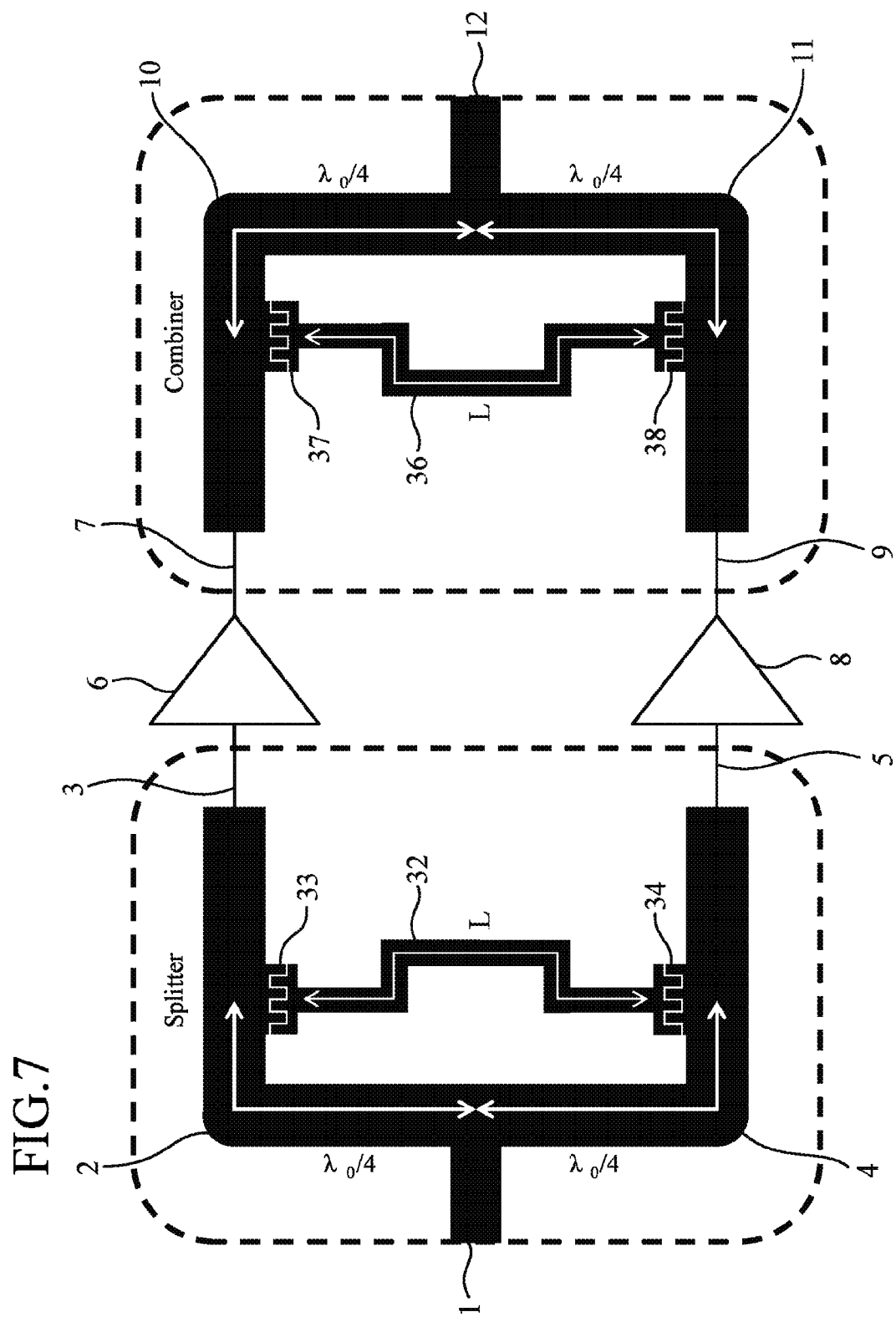
FIG. 7 is a schematic diagram showing a circuit pattern for a case in which the high-frequency power amplifier of FIG. 6 is implemented by microstrip lines of a metal pattern on a dielectric substrate.

FIG. 7 is a schematic diagram showing a circuit pattern for a case in which the high-frequency power amplifier of FIG. 6 is implemented by microstrip lines of a metal pattern on a dielectric substrate.

In FIG. 7, the tuned capacitors 33, 34, 37, and 38 are implemented by interdigital capacitors of a metal pattern. Alternatively, the tuned capacitors 33, 34, 37, and 38 can be implemented by metal-insulator-metal calitors (hereinafter, referred to as "MIM capacitors") which are often used in monolithic microwave integrated circuits, and/or chip capacitors.

Next, an operation will be described.

In the line having a length shorter than the ½-wavelength, considering the anti-phase mode, its central point becomes a node of a voltage standing wave and thus can be considered as a virtual grounding point.

When the central point is the virtual grounding point, since a length from the central point to the point at which a capacitor is connected is ¼ wavelength or less, the impedance as viewed from the point at which the capacitor is connected is an inductive reactance.

Since, in the second embodiment, a capacitive reactance of each of the tuned capacitors 33, 34, 37, and 38 is inserted in series with the inductive reactance, the tuned lines 31 and 35 produce series resonance. Hence, the tuned lines 31 and 35 can have a function similar to that of the tuned lines 13 and 14 which are one-wavelength lines of the above-described first embodiment.

Figure 8:
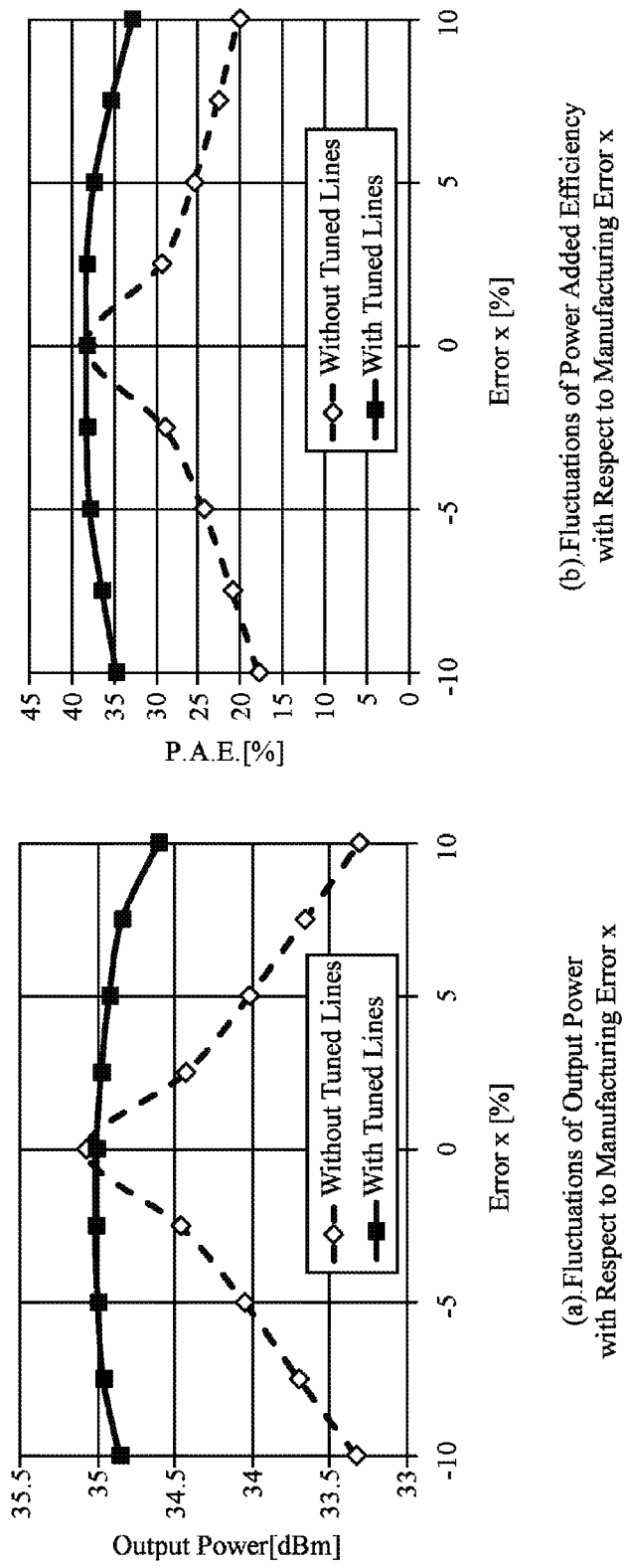
FIG. 8 illustrates diagrams showing characteristics of output power and power added efficiency with respect to a manufacturing error x of one amplifier element.

Here, FIG. 8 illustrates diagrams showing characteristics of output power and power added efficiency with respect to a manufacturing error x of one amplifier element.

Particularly, FIG. 8(*a*) shows fluctuations of output power with respect to the manufacturing error x, and FIG. 8(*b*) shows fluctuations of power added efficiency with respect to the manufacturing error x.

In FIG. 8, solid lines represent characteristics for a case with the tuned lines 31 and 35, and dashed lines represent characteristics for a case with no tuned lines 31 and 35.

In the case with no tuned lines 31 and 35, the characteristics change abruptly with respect to the manufacturing error x of one amplifier element. On the other hand, in the case with the tuned lines 31 and 35, even if there is some manufacturing error x, reduction in the characteristics is small.

Therefore, even if an amplifier element's manufacturing error x with a certain probability distribution occurs, the yield of amplifier elements can be increased.

As is clear from the above descriptions, according to the second embodiment, the tuned line 31 connected between the branch terminal 3 and the branch terminal 5 is configured as the series circuit comprised of the tuned capacitors 33 and 34 and the less-than-½-wavelength line 32 which is a line having a length shorter than one-half wavelength ($=\lambda_0/2$) of the fundamental wave, and the tuned line 35 connected between the combining terminal 7 and the combining terminal 9 is configured as the series circuit comprised of the tuned capacitors 37 and 38 and the less-than-½-wavelength line 36 which is a line having a length shorter than one-half wavelength ($=\lambda_0/2$) of the fundamental wave. This, as with the above-described first embodiment, enables reduction of a non-uniform voltage distribution occurring due to the difference in characteristics between the two amplifier elements 6 and $. Further, the line lengths of the tuned lines 31 and 35 can be made shorter than the one wavelength to thereby achieve the effect that the circuit area occupied by the tuned lines 31 and 35 can be reduced compared with the above-described first embodiment.

Third Embodiment

Figure 9:
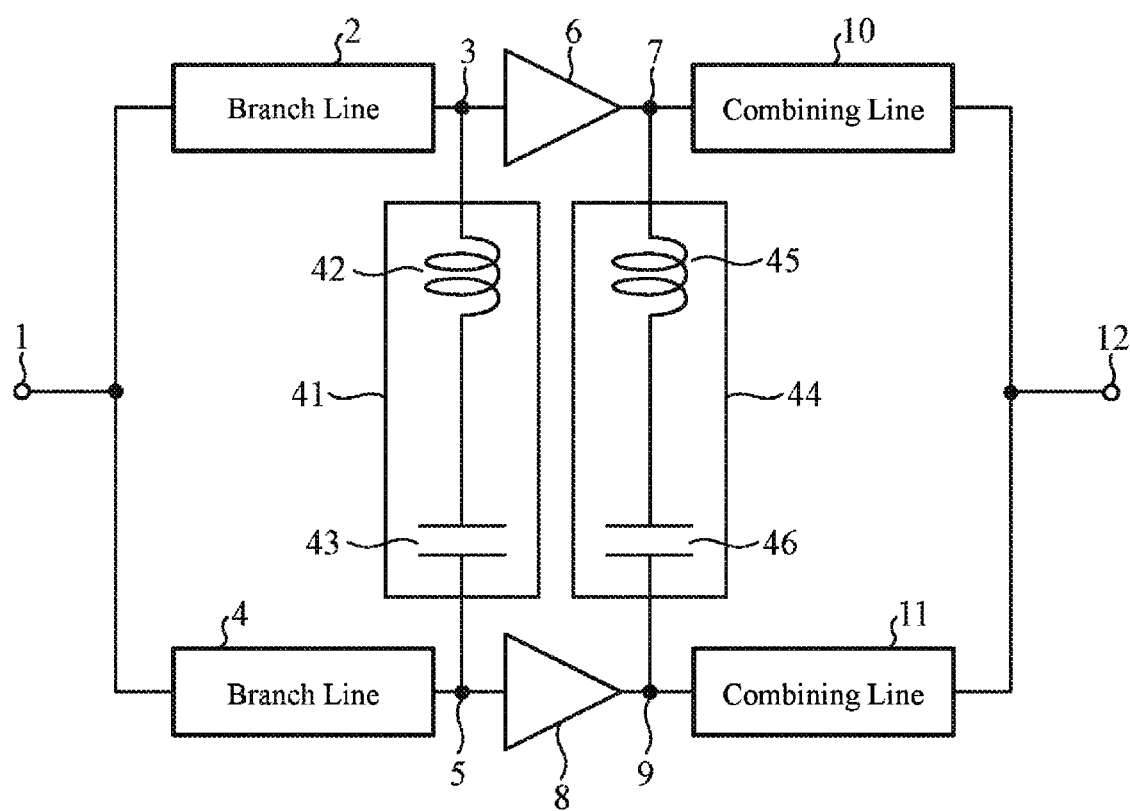
FIG. 9 is a configuration diagram showing a high-frequency power amplifier according to a third embodiment of the present invention.

FIG. 9 is a configuration diagram showing high-frequency power amplifier according to a third embodiment of the present invention. In the drawing, the same reference numerals as those in FIG. 1 indicate the same or corresponding portions and thus their descriptions are omitted.

A tuned line 41 is connected between a branch terminal 3 and a branch terminal 5, and is comprised of a series circuit having a tuned inductor 42 and a tuned capacitor 43 which are connected in series with each other. It is most effective that the tuned inductor 42 and the tuned capacitor 43 be selected so as to provide series resonance with respect to a fundamental wave.

A tuned line 44 is connected between a combining terminal 7 and a combining terminal 9, and is comprised of a series circuit having a tuned inductor 15 and a tuned capacitor 46 which are connected in series with each other. It is most effective that the tuned inductor 45 and the tuned capacitor 46 be selected so as to provide series resonance with respect to a fundamental wave.

In the example of FIG. 9 both the tuned line 41 and the tuned line 44 are mounted. Nonetheless, at least one of the tuned line 41 and the tuned line 44 needs to be mounted, thereby enabling reduction of a non-uniform voltage distribution occurring due to the difference in characteristics between an amplifier element 6 and an amplifier element 8.

Figure 10:
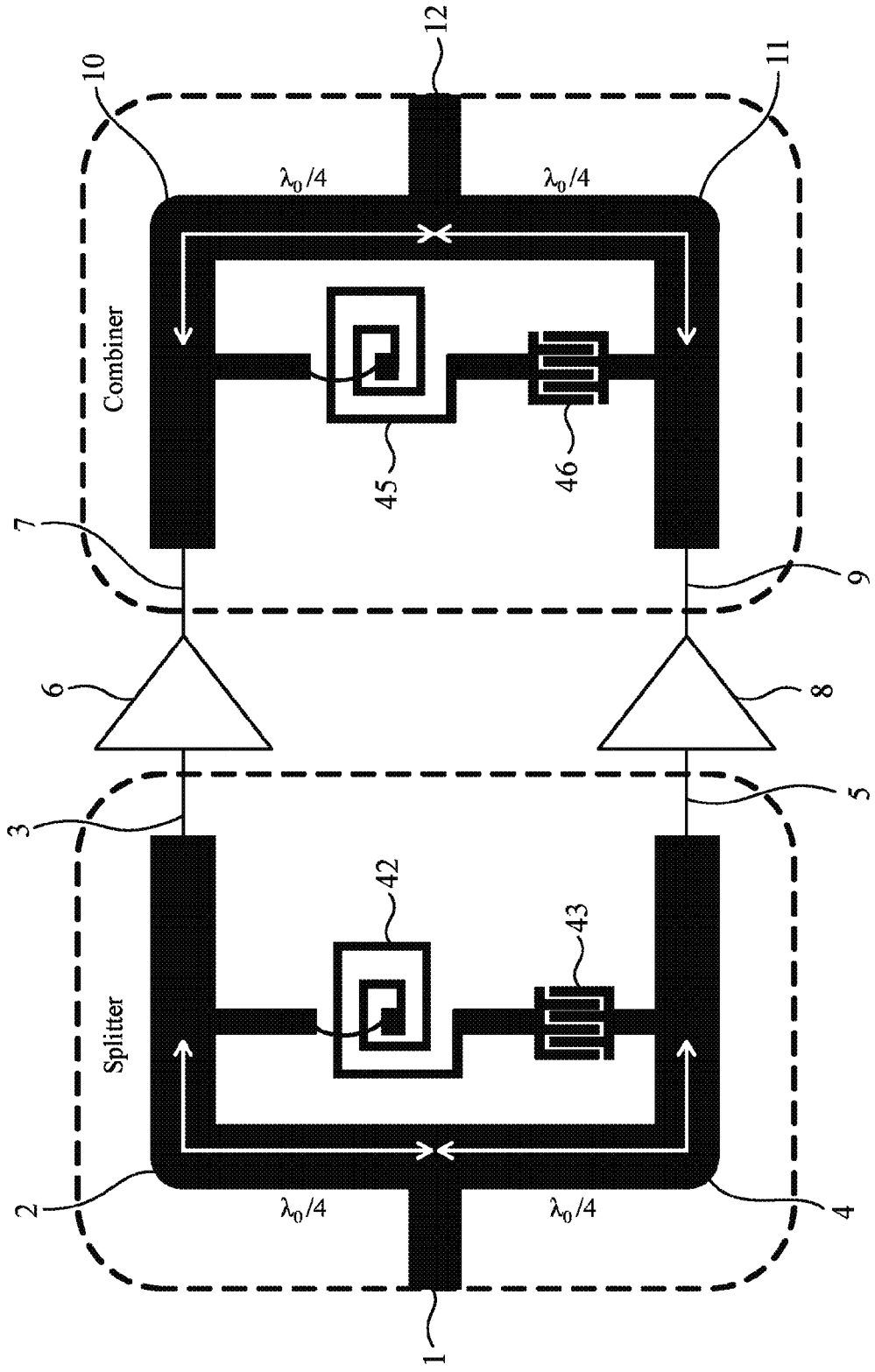
FIG. 10 is a schematic diagram showing a circuit pattern for a case in which the high-frequency power amplifier of FIG. 9 is implemented by microstrip lines of a metal pattern on a dielectric substrate.

FIG. 10 is a schematic diagram showing a circuit pattern for a case in which the high-frequency power amplifier of FIG. 9 is implemented by microstrip lines of a metal pattern on a dielectric substrate.

In FIG. 10, tuned capacitors 43 and 46 are implemented by interdigital capacitors of a metal pattern. Alternatively, tuned capacitors 43 and 46 can be implemented by MIM capacitors which are often used in monolithic microwave integrated circuits, and/or chip capacitors.

In FIG. 10, each of tuned inductors 42 and 45 is implemented by a spiral inductor and/or a extraction wire. Alternatively, each of tuned inductors 42 and 45 can be implemented only by a wire or by a chip inductor.

In the above-described first embodiment, it is described that the tuned lines 13 and 14 each having a length of one wavelength ($=\lambda_0$) of the fundamental wave are connected between the terminals. Instead of the tuned lines 13 and 14, the tuned line 41 having the tuned inductor 42 and the tuned capacitor 43 which are connected in series with each other can be connected between the terminals, and the tuned line 44 having the tuned inductor 45 and the tuned capacitor 46 which are connected in series with each other can be connected between the terminals.

In this case, the tuned inductor 42 and the tuned capacitor 43 in the tuned line 41 produce series resonance, and the tuned inductor 45 and the tuned capacitor 16 in the tuned line 44 produce series resonance. Thus, the tuned lines 41 and 44 can have a function similar to that of the tuned lines 13 and 14 which are one-wavelength lines of the above-described first embodiment.

As is clear from the above, according to the third embodiment, the tuned line 41 connected between the branch terminal 3 and the branch terminal 5 is configured as the series circuit comprised of the tuned inductor 42 and the tuned capacitor 43, and the tuned line 44 connected between the combining terminal 7 and the combining terminal 9 is configured as the series circuit comprised of the tuned inductor 45 and the tuned capacitor 46. This, as with the above-described first embodiment, enables reduction of a non-uniform voltage distribution occurring due to the difference in characteristics between the two amplifier elements 6 and 8. Further, there is no need to connect the one-wavelength line length. This can achieve the effect that the circuit area occupied by the tuned lines 41 and 44 can be reduced compared with the above-described first embodiment.

Fourth Embodiment

Figure 11:
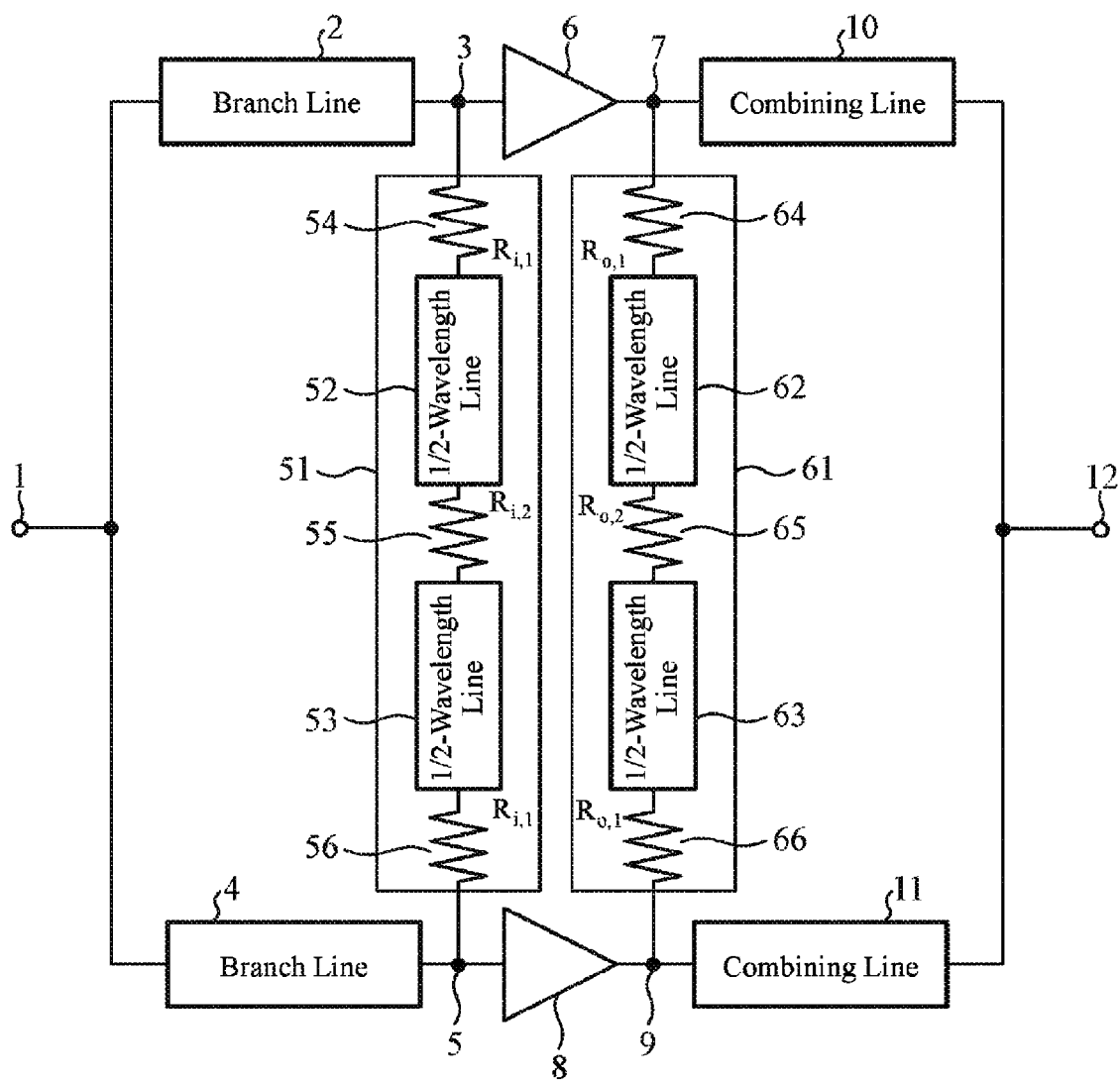
FIG. 11 is a configuration diagram showing a high-frequency power amplifier according to a fourth embodiment of the present invention.

FIG. 11 is a configuration diagram showing a high-frequency power amplifier according to a fourth embodiment of the present invention. In the drawing, the same reference numerals as those in FIG. 1 indicate the same or corresponding portions, and thus their descriptions are omitted.

A tuned line 51 is connected between a branch terminal 3 and a branch terminal 5. The tuned line 51 is configured such that ½-wavelength lines 52 and 53 and oscillation suppression resistors 54, 55, and 56 are connected in series.

Here, an example in which the tuned line 51 has a length of one wavelength ($=\lambda_0$) will be described. Nonetheless, the length of the tuned line 51 is not limited to the one wavelength and may be n wavelengths (where n is a natural number)

Each of the ½-wavelength lines 52 and 53 has an impedance $Z_{0is}$ and has a line length of one-half wavelength ($=\lambda_0/2$) of a fundamental wave of a signal input from an input terminal 1.

The oscillation suppression resistor 54 is a resistor with a resistance value $R_{i,1}$ which is loaded on the tuned line 51 for the purpose of suppressing oscillation.

The oscillation suppression resistor 55 is a resistor with a resistance value $R_{i,2}$ which is loaded on the tuned line 51 for the purpose of suppressing oscillation.

The oscillation suppression resistor 56 is a resistor with a resistance value $R_{i,1}$ which is loaded on the tuned line 51 for the purpose of suppressing oscillation.

A tuned line 61 is connected between a combining terminal 7 and a combining terminal 9. The tuned line 61 is configured such that ½-wavelength lines 62 and 63 and oscillation suppression resistors 64, 65, and 66 are connected in series.

Here, an example in which the tuned line 61 has a length of one wavelength ($=\lambda_0$) will be described. Nonetheless, the length of the tuned line 61 is not limited to the one wavelength and may be n wavelengths (where n is a natural number).

Each of the ½-wavelength lines 62 and 63 has an impedance $Z_{0os}$ and has a line length of one-half wavelength ($=\lambda_0/2$) of the fundamental wave of the signal input from the input terminal 1.

The oscillation suppression resistor 64 is a resistor with a resistance value $R_{o,\,2}$ which is loaded on the tuned line 61 for the purpose of suppressing oscillation.

The oscillation suppression resistor 65 is a resistor with a resistance value $R_{o,\,2}$ which is loaded on the tuned line 61 for the purpose of suppressing oscillation.

The oscillation suppression resistor 66 is a resistor with a resistance value $R_{o,\,1}$ which is loaded on the tuned line 61 for the purpose of suppressing oscillation.

In the above-described first embodiment, it is described that the tuned lines 13 and 14 each having a length of one wavelength ($=\lambda_0$) of the fundamental wave are connected between the terminals. However, there is the possibility that the tuned lines 13 and 14 may cause oscillation at a low-frequency region.

In the fourth embodiment, the possibility of oscillation at the low-frequency region can be prevented by dividing a tuned line having a length of one wavelength ($=\lambda_0$) of a fundamental wave into two equal parts, and loading the oscillation suppression resistors 54, 55, and 56 (oscillation suppression resistors 64, 65, and 66) in series with the two ½-wavelength lines 52 and 53 (½-wavelength lines 62 and 63).

First, half-frequency wave oscillation which may occur in the tuned lines 13 and 14 of FIG. 1 will be described.

When the tuned lines 13 and 14 are excited in an in-phase mode, a voltage standing wave has anti-nodes at the centers of the tuned lines 13 and 14, independently of frequencies due to symmetry.

At this time, with respect to a wave having a frequency of one-half of a fundamental wave (hereinafter, a half-frequency wave), the standing wave has anti-nodes at the centers of the tuned lines 13 and 14. Then, in considering both ends of each of the tuned lines 13 and 14, since a ¼-wavelength position is different in the half-frequency wave, a relationship between an anti-node and a node is reversed, causing the both ends to be nodes. Since the nodes of the voltage standing wave can be considered as virtual grounding points, the branch terminals 3 and 5 and the combining terminals 7 and 9 become virtual grounding points.

When the branch terminals 3 and 5 and the combining terminals 7 and 9 are virtually grounded, strong reflections of electromagnetic waves occur at the branch terminals 3 and 5 and the combining terminals 7 and 9. When the strong reflections occur at the branch terminals 3 and 5 and the combining terminals 7 and 9, reflection coefficients of the circuit side as viewed from the amplifierier elements 6 and 8 become large, thereby possibly causing oscillation at the worst.

Next, the reason for loading the oscillation suppression resistors 54, 55, and 56 (oscillation suppression resistors 64, 65, and 66) to reduce the possibility of the occurrence of half-frequency wave oscillation will be described.

The fact that both ends of the tuned lines 51 and 61 become virtual grounding points in a half-frequency wave in-phase mode is the same as the case of the above-described first embodiment.

In this regard, in the fourth embodiment, the oscillation suppression resistors 54 and 56 (oscillation suppression resistors 64 and 66) are loaded at both ends of the tuned line 51 (tuned line 61), and the oscillation suppression resistor 55 (oscillation suppression resistor 65) is loaded between the ½-wavelength line 52 and the ½-wavelength line 53 (between the ½-wavelength line 62 and the ½-wavelength line 63) Thus, the branch terminals 3 and 5 which are connecting points between the tuned lines 51 and the branch lines 2 and 4 do not become virtual grounding points, and the combining terminals 7 and 9 which are connecting points between the tuned lines 61 and the combining lines 10 and 11 do not become virtual grounding points.

At the branch terminals 3 and 5, the oscillation suppression resistors 54 and 56 operate so as to be connected in parallel to primary lines. At the combining terminals 7 and 9, the oscillation suppression resistors 64 and 66 operate so as to be connected in parallel to primary lines.

Figure 12:
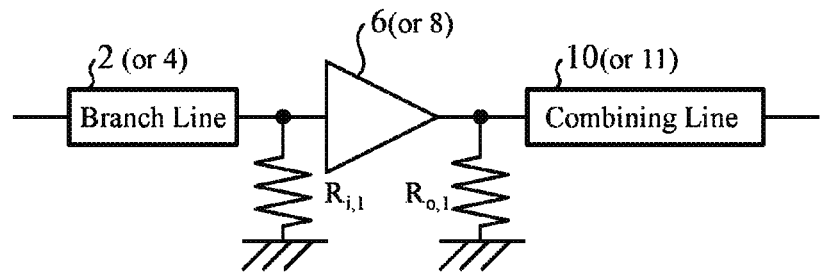
FIG. 12 is a diagram showing an equivalent circuit around one amplifier element in a half-frequency wave in-phase mode.

Here, FIG. 12 shows an equivalent circuit around one amplifier element.

When resistance values $R_{i,\,1}$ of the oscillation suppression resistors 54 and 56 and resistance values $R_{o,\,1}$ of the oscillation suppression resistors 64 and 66 are appruately selected, an electromagnetic wave in the half-frequency wave in-phase mode is consumed by the oscillation suppression resistors 54, 56, 64, and 66.

Therefore, strong reflections do not occur at the branch terminals 3 and 5 and the combining terminals 7 and 9. Thus, the reflection coefficients become small, thereby reducing the possibility of oscillation in the half-frequency wave in-phase mode.

On the other hand, in considering the case of a half-frequency wave anti-phase mode, the central point of the oscillation suppression resistor 55 (oscillation suppression resistor 65) becomes a node of a voltage standing wave.

Hence, a virtual grounding point is the center of the oscillation suppression resistor 55 (oscillation suppression resistor 65). Therefore, the tuned line 51 (tuned line 61) can be considered as the circuit in which the half parts of the oscillation suppression resistor 55 (oscillation suppression resistor 65) each have a resistance value $R_{i,\,2}/2$ ($R_{o,\,2}/2$) and are connected to their respective ¼-wavelength lines (½-wavelength lines for the fundamental wave) that are connected to their respective oscillation suppression resistors 54 and 56 (oscillation suppression resistors 64 and 66).

Figure 13:
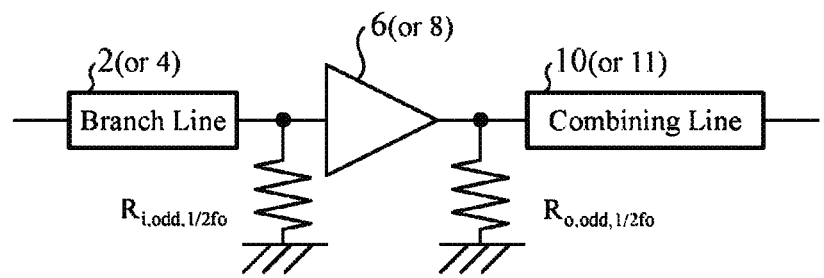
FIG. 13 is a diagram showing an equivalent circuit existing around one amplifier element in a half-frequency wave anti-phase mode.

In this case, an operation is performed such that resistors having resistance values $R_{i,\,odd,\,1/2f0}$ and $R_{o,\,odd,\,1/2f0}$ given in the following equation (1) are connected in parallel to the primary lines. In this case, the resistors can be considered as an equivalent circuit shown in FIG. 13.

$$\begin{cases} R_{i,odd,1/2f0} = R_{i,1} + 2\dfrac{Z_{0is}^2}{R_{i,2}} \\ R_{o,odd,1/2f0} = R_{o,1} + 2\dfrac{Z_{0os}^2}{R_{o,2}} \end{cases} \quad (1)$$

When the resistance values $R_{i,\,2}$ and $R_{o,\,2}$ of the oscillation suppression resistors 55 and 65 and the characteristic impedances of the ½-wavelength lines 52, 53, 62, and 63 are appropriately selected, an electromagnetic wave in the half-frequency wave anti-phase mode is consumed by the oscillation suppression resistors 55 and 65.

Therefore, strong reflection does not occur at the branch terminals 3 and 5 and the combining terminals 7 and 9. Thus, the reflection coefficients become small, thereby reducing the possibility of oscillation in the half-frequency wave anti-phase mode.

In the fourth embodiment, the oscillation suppression resistors 54, 55, and 56 (oscillation suppression resistors 64, 65, and 66) are loaded on the tuned line 51 (tuned line 61). By loading the oscillation suppression resistors 54, 55, and 56 (oscillation suppression resistors 64, 65, and 66), the yield of amplifier elements can be increased for a bit different reason from the reason in the above-described first embodiment.

In considering voltage standing waves in fundamental wave anti-phase mode in the tuned lines 51 and 61, the central points of the oscillation suppression resistors 55 and 65 become nodes of the voltage standing waves due to symmetry.

Hence, the centers of the oscillation suppression resistors 55 and 65 become virtual grounding points. The tuned line 51 (tuned line 61) can be considered as the circuit in which the half parts of the oscillation suppression resistor 55 (oscillation suppression resistor 65) each have a resistance value $R_{i,2}/2$ ($R_{o,2}/2$) and are connected to their respective ¼-wavelength lines (½-wavelength lines for the fundamental wave) that are connected to their respective oscillation suppression resistors 54 and 56 (oscillation suppression resistors 64 and 66).

Therefore, an operation is performed such that resistors having resistance values $R_{i,odd,f0}$ and $R_{o,odd,f0}$ given in the following equation (2) are connected in parallel to the branch lines 2 and 4 and the combining lines 10 and 11.

$$\begin{cases} R_{i,odd,fo} = R_{i,1} + \dfrac{R_{i,2}}{2} \\ R_{o,odd,fo} = R_{o,1} + \dfrac{R_{o,2}}{2} \end{cases} \quad (2)$$

Figure 14:
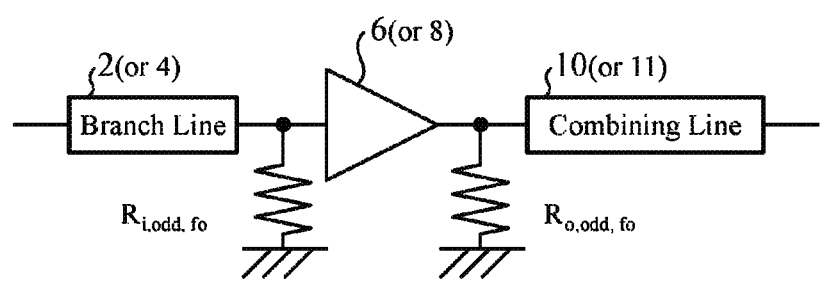
FIG. 14 is a diagram showing an equivalent circuit existing around one amplifier element in a fundamental wave anti-phase mode.

Here, FIG. 14 shows an equivalent circuit around one amplifier element in the fundamental wave anti-phase mode.

Since a portion around each of the amplifier elements 6 and 8 can be considered as the equivalent circuit shown in FIG. 14, when the resistance values $R_{i,1}$ and $R_{i,2}$ ($R_{o,1}$ and $R_{o,2}$) of the oscillation suppression resistors 54, 55, and 56 (oscillation suppression resistors 64, 65, and 66) are appropriately selected, an electromagnetic wave in the fundamental wave anti-phase mode is consumed by the oscillation suppression resistors 54, 55, and 56 (oscillation suppression resistors 64, 65, and 66)

On the other hand, in considering a voltage standing wave in a fundamental wave in-phase mode, the central point of the oscillation suppression resistor 55 (oscillation suppression resistor 65) becomes an anti-node of the voltage standing wave. Hence, current in the in-phase mode does not flow through the oscillation suppression resistor 55 (oscillation suppression resistor 65) at all. Therefore, terminals on the center sides of the tuned lines 51 and 61 can be considered as virtual open points.

The ½-wavelength lines 52 and 53 (½-wavelength lines 62 and 63) are connected to the virtual open point. Since, in the ½-wavelength lines 52 and 53 (½-length lines 62 and 63), a relationship between the anti-node and node of the standing wave is reversed twice, connecting points of the ½-wavelength lines 52 and 53 (½-wavelength lines 62 and 63) to the oscillation suppression resistors 54 and 56 (oscillation suppression resistors 64 and 66) become anti-nodes.

Therefore, the connecting points of the ½-wavelength lines 52 and 53 (½-wavelength lines 62 and 63) to the oscillation suppression resistors 54 and 56 (oscillation suppression resistors 64 and 66) can be considered as virtual open points. Thus, current does not flow through the oscillation suppression resistors 54 and 56 (oscillation suppression resistors 64 and 66), and, accordingly, it can be considered as if the oscillation suppression resistors 54 and (oscillation suppression resistors 64 and 66) were not connected (see FIG. 15).

Figure 15:
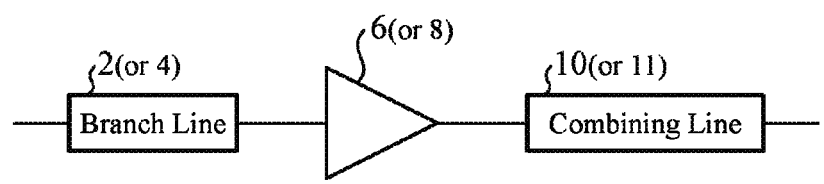
FIG. 15 is a diagram showing an equivalent circuit around one amplifier element in a fundamental wave in-phase mode.

FIG. 15 shows an equivalent circuit around one amplifier element in the fundamental wave in-phase mode.

From the above description, it can be seen that, while an electromagnetic wave in the fundamental wave anti-phase mode causing the unbalanced operation between the amplifier element 6 and the amplifier element 8 is absorbed, an electromagnetic wave in the fundamental wave in-phase mode required for amplification is not absorbed. This causes reduction of the non-uniform operation, thus enabling the amplifier elements 6 and 8 to fully exhibit their capability.

Figure 16:
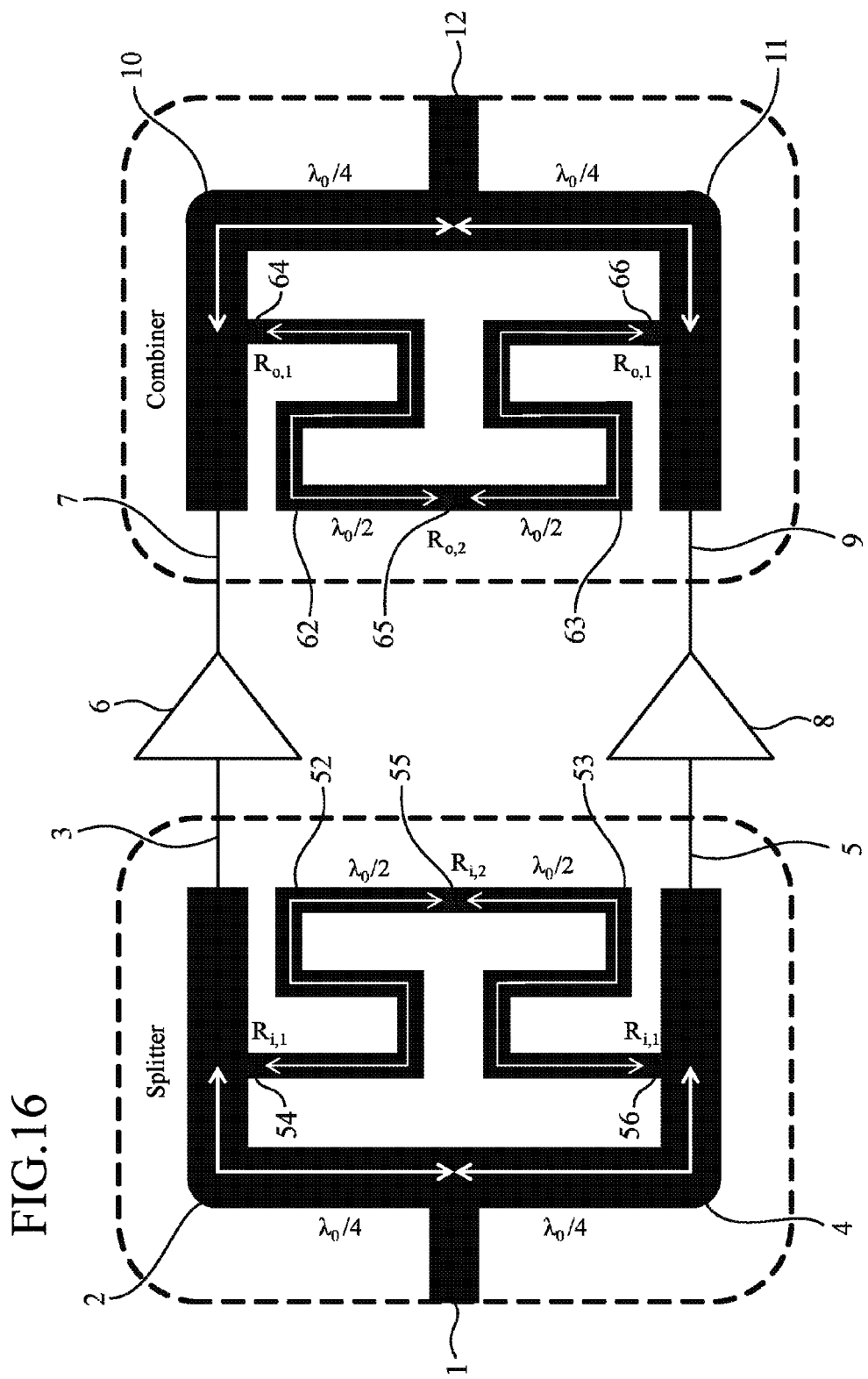
FIG. 16 is a schematic diagram showing a circuit pattern for a case in which transmission line portions of a high-frequency power amplifier of FIG. 15 are formed on a dielectric substrate by a metal pattern, and oscillation suppression resistors are implemented by thin-film resistors on the dielectric substrate.

Here, FIG. 16 is a schematic diagram showing a circuit pattern for a case in which transmission line portions of a high-frequency power amplifier of FIG. 15 are formed on a dielectric substrate by a metal pattern, and oscillation suppression resistors are implemented by thin-film resistors on the dielectric substrate.

For the oscillation suppression resistors 54, 55, and 56 (oscillation suppression resistors 64, 65, and 66), not only thin-film resistors but also a surface mount type and so forth may be used.

Figure 17:
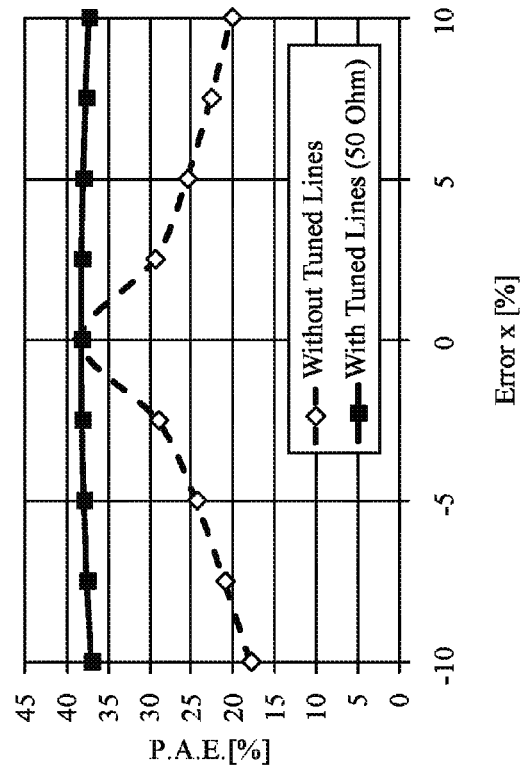
FIG. 17 illustrates diagrams showing characteristics of output power and power added efficiency with respect to a manufacturing error x of one amplifier element.
Figure 17:
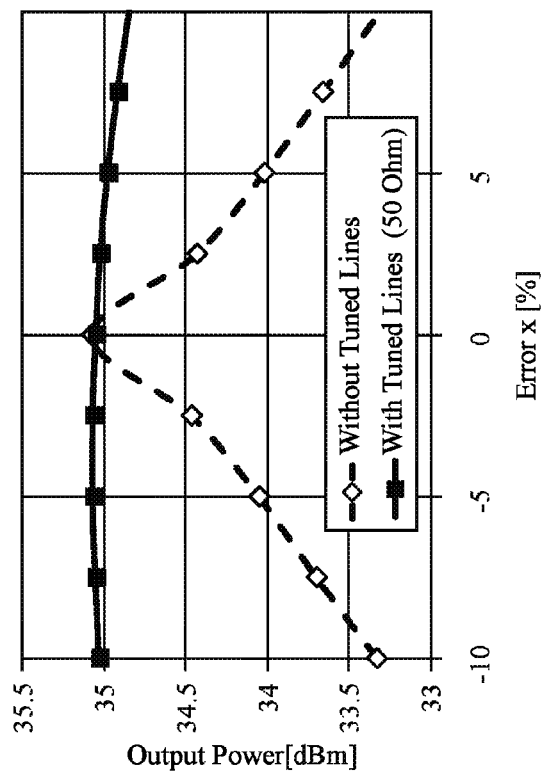

FIG. 17 illustrates diagrams showing characteristics of output power and power added efficiency with respect to a manufacturing error x of one amplifier element.

Particularly, FIG. 17(a) shows fluctuations of output power with respect to the manufacturing error x, and FIG. 17(b) shows fluctuations of power added efficiency with respect to the manufacturing error a.

In FIG. 17, solid lines represent characteristics for a case with the tuned lines 51 and 61, and dashed lines represent characteristics for a case with no tuned lines 51 and 61.

In the case with no tuned lines 51 and 61, the characteristics change abruptly with respect to the manufacturing error x of one amplifier element. In the case with the tuned lines 51 and 61, even if there is some manufacturing error a, a reduction in the characteristics is small.

Therefore, even if an amplifier element's manufacturing error x with a certain probability distribution occurs, the yield of amplifier elements can be increased.

Figure 18:
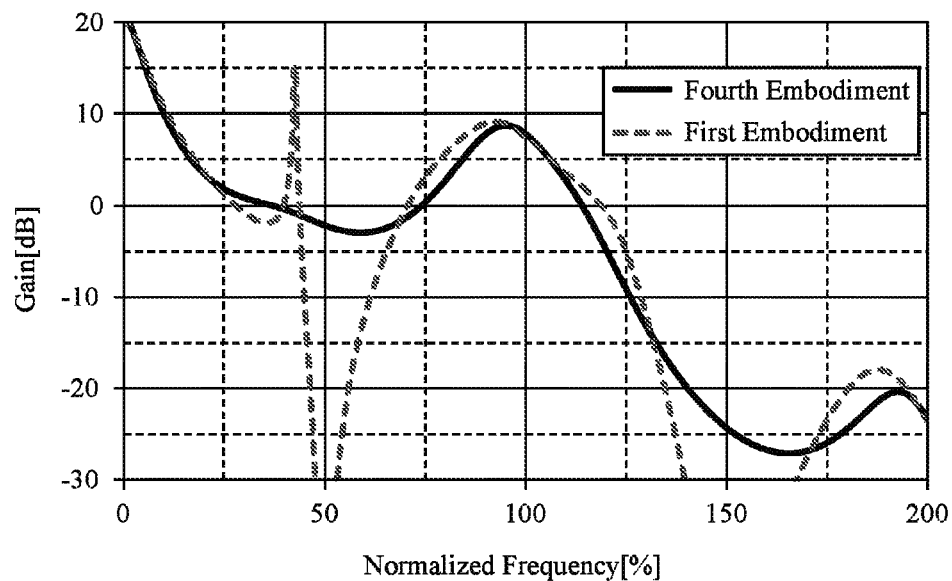
FIG. 18 is an illustrative diagram showing small-signal gain versus frequency characteristics of the first and fourth embodiments of the present invention.

In addition, FIG. 18 is an illustrative diagram showing small-signal gain versus frequency characteristics of the first and fourth embodiments.

In FIG. 18, a horizontal axis represents a frequency normalized by a fundamental wave frequency in percentage.

In a fundamental wave (normalized frequency: 100%), there is no large difference between the results obtained by the above-described first embodiment and the fourth embodiment, but there is a large difference near a half-frequency wave (normalized frequency: 50%).

Namely, in the above-described first embodiment, the gain changes abruptly and there is a point where the gain increases abnormally; on the other hand, in the fourth embodiment, the change in the gain is smooth and there is no point where the gain increases abnormally. This indicates stabilization against oscillation of the half-frequency wave.

Figure 19:
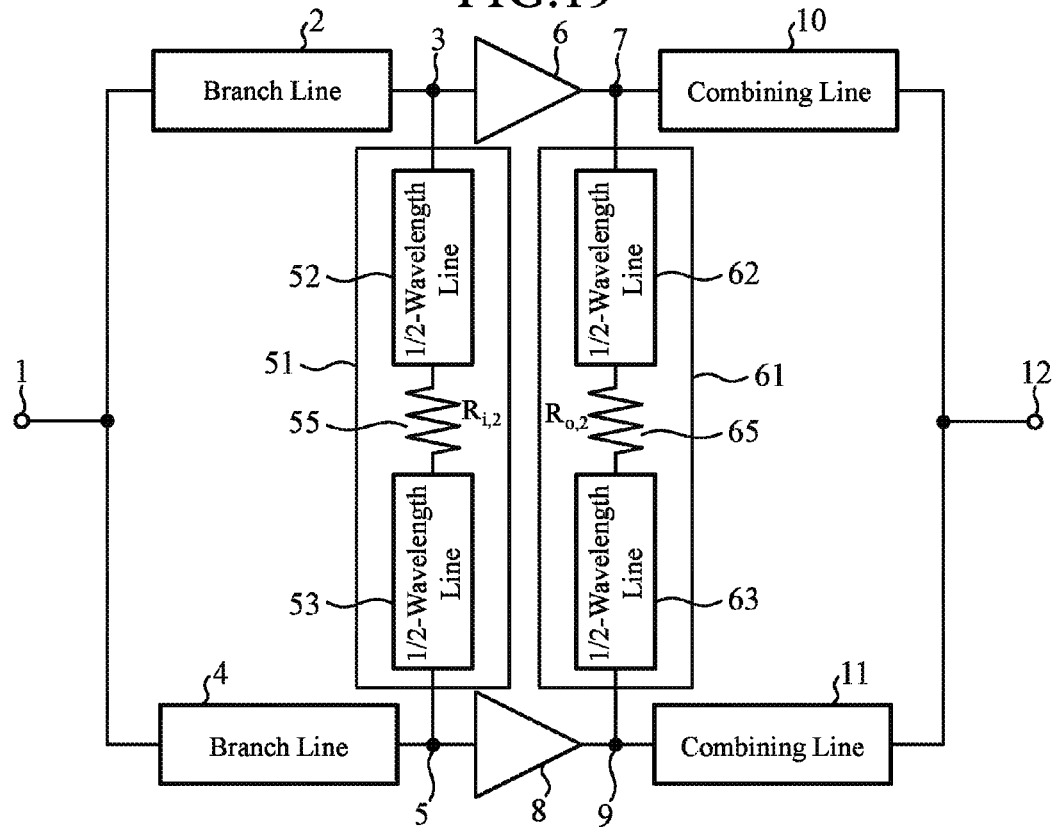
FIG. 19 is a configuration diagram showing a simplified high-frequency power amplifier according to the fourth embodiment of the present invention.

In the fourth embodiment, it is described that the oscillation suppression resistors 54, 55, and 56 (oscillation suppression resistors 64, 65, and 66) are loaded on the tuned line 51 (tuned line 61). Alternatively, as shown in FIG. 19, only the oscillation suppression resistor 55 (oscillation suppression resistor 65) can be loaded on the tuned line 51 (tuned line 61) without the oscillation suppression resistors 54 and 56 (oscillation suppression resistors 64 and 66).

In this case, the possibility of oscillation of the fundamental wave anti-phase mode can be reduced.

Figure 20:
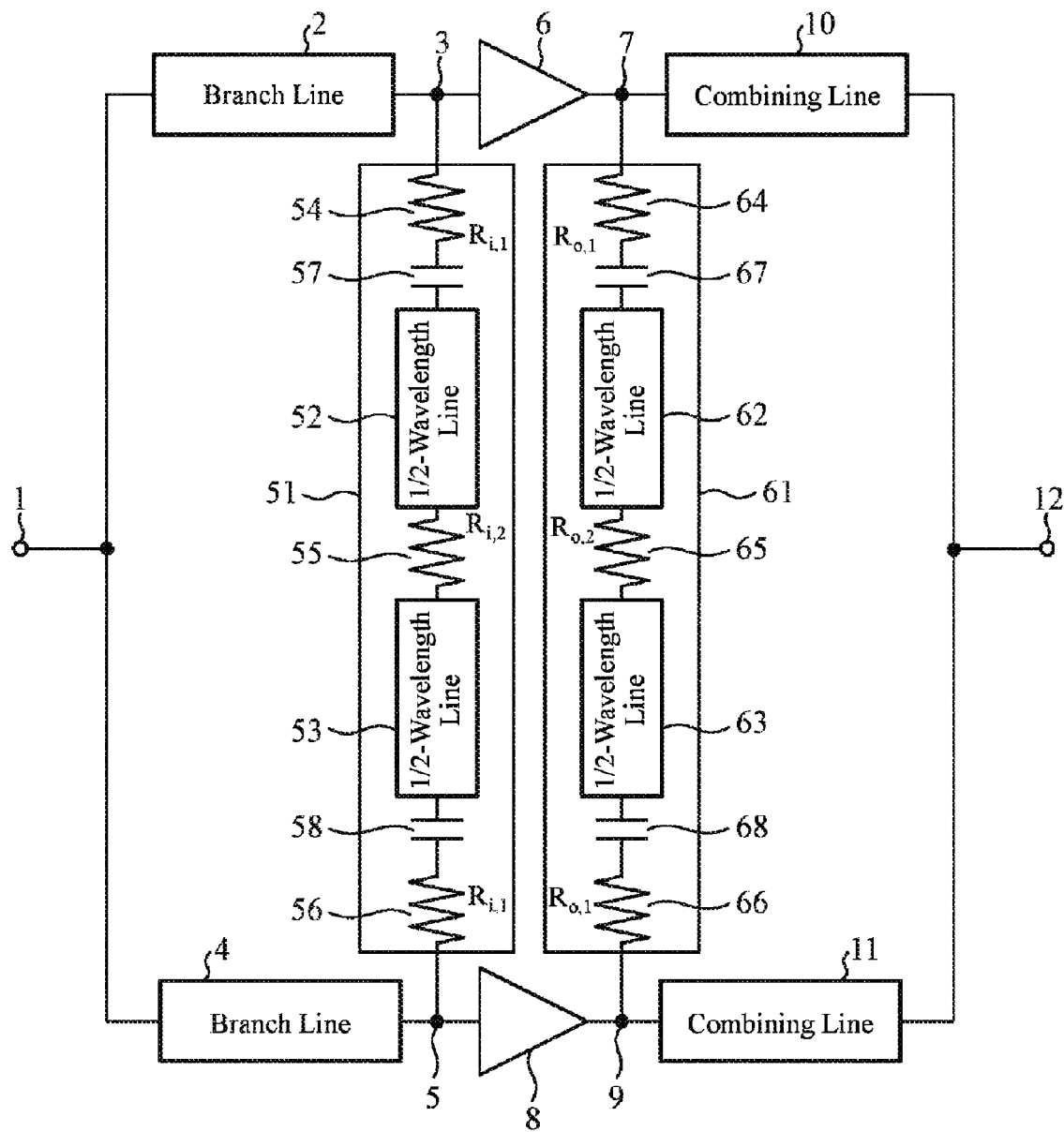
FIG. 20 is a configuration diagram showing another high-frequency power amplifier according to the fourth embodiment of the present invention.

Further, in the fourth embodiment, it is described that the oscillation suppression resistors 54, 55, and 56 (oscillation suppression resistors 64, 65, and 66) are loaded on the tuned line 51 (tuned line 61). As shown in FIG. 20, tuned capacitors 57 and 58 may be further loaded on the tuned line 51, and tuned capacitors 67 and 68 may be further loaded on the tuned line 61.

Fifth Embodiment

Figure 21:
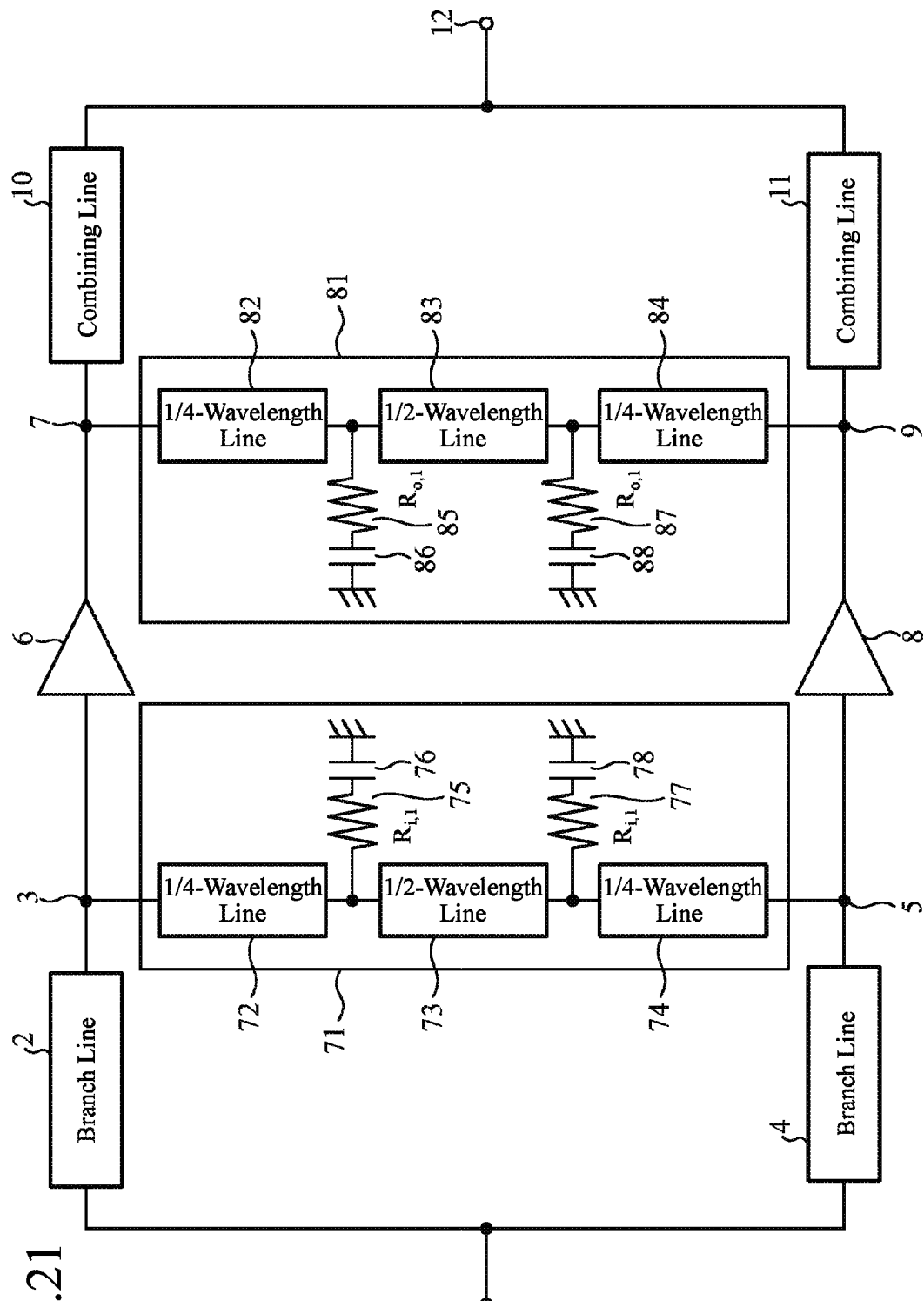
FIG. 21 is a configuration diagram showing a high-frequency power amplifier according to a fifth embodiment of the present invention.

FIG. 21 is a configuration diagram showing a high-frequency power amplifier according to a fifth embodiment of the present invention. In the drawing, the same reference numerals as those in FIG. 1 indicate the same or corresponding portions, and thus their descriptions are omitted.

A tuned line 71 is connected between a branch terminal 3 and a branch terminal 5. The tuned line 71 is comprised of: a series circuit of ¼-wavelength lines 72 and 74 and a ½-wavelength line 73; and grounding circuits each having a resistor and a bias cut-off capacitor which are connected in series with each other.

Here, an example in which the tuned line 71 has a length of one wavelength ($=\lambda_0$) will be described. Nonetheless, the length of the tuned line 71 is not limited to one wavelength and may be n wavelengths (where n is a natural number).

The ¼-wavelength lines 72 and 74 each have an impedance $Z_{0is}$ and has a line length of one-quarter wavelength ($=\lambda_0/4$) of a fundamental wave of a signal input from an input terminal 1.

The ½-wavelength line 73 has an impedance $Z_{0is}$ and has a line length of one-half wavelength ($=\lambda_0/2$) of the fundamental wave of the signal input from the input terminal 1.

An oscillation suppression resistor 75 is a resistor with a resistance value $R_{i,\,1}$ which is connected for the purpose of suppressing oscillation. One end of the oscillation suppression resistor 75 is connected between the ¼-wavelength line 72 and the ½-wavelength line 73, namely, connected to a point that is spaced ¼ wavelength of the fundamental wave away from the center of the tuned line 71.

A bias cut-off capacitor 76 is a capacitor connected for the purpose of cutting off a bias.

An oscillation suppression resistor 77 is a resistor with a resistance value $R_{i,\,1}$ which is connected for the purpose of suppressing oscillation. One end of the oscillation suppression resistor 77 is connected between the ¼-wavelength line 74 and the ½-wavelength line 73, namely, connected to a point that is spaced ¼ wavelength of the fundamental wave away from the center of the tuned line 71.

A bias cut-off capacitor 78 is a capacitor connected for the purpose of cutting off a bias.

A tuned line 81 is connected between a combining terminal 7 and a combining terminal 9. The tuned line 81 is comprised of: a series circuit of ¼-wavelength lines 82 and 84 and a ½-wavelength line 83; and grounding circuits each having a resistor and a bias cut-off capacitor which are connected in series with each other.

Here, an example in which the tuned line 81 has a length of one wavelength ($=\lambda_0$) will be described. Nonetheless, the length of the tuned line 81 is not limited to one wavelength and may be n wavelengths (where n is a natural number).

The ¼-wavelength lines 82 and 84 each have an impedance $Z_{0os}$ and have a line length of one-quarter wavelength ($=\lambda_0/4$) of the fundamental wave of the signal input from the input terminal 1.

The ½-wavelength line 83 has an impedance $Z_{0os}$ and has a line length of one-half wavelength ($=\lambda_0/2$) of the fundamental wave of the signal input from the input terminal 1.

An oscillation suppression resistor 85 is a resistor with a resistance value $R_{o,\,1}$ which is connected for the purpose of suppressing oscillation. One end of the oscillation suppression resistor 85 is connected between the ¼-wavelength line 82 and the ½-wavelength line 83, namely, connected to a point that is spaced ¼ wavelength of the fundamental wave away from the center of the tuned line 81.

A bias cut-off capacitor 86 is a capacitor connected for the purpose of cutting off a bras.

An oscillation suppression resistor 87 is a resistor with a resistance value $R_{o,\,1}$ which is connected for the purpose of suppressing oscillation. One end of the oscillation suppression resistor 87 is connected between the ¼-wavelength line 84 and the ½-wavelength line 83, namely, connected to a point that is ¼ wavelength of the fundamental wave away from the center of the tuned line 81.

A bias cut-off capacitor 88 is a capacitor connected for the purpose of cutting off a bias.

The basic operation of the high-frequency power amplifier or the fifth embodiment is the same as that of the above-described first embodiment. In this regard, since the oscillation suppression resistors 75 and 77 (oscillation suppression resistors 85 and 87) are loaded on the tuned line (tuned line 81), as with the above-described fourth embodiment, the possibility of oscillation in a low-frequency region can be reduced.

In the fifth embodiment, grounding is performed through the bias cut-off capacitors 76 and 78 (bias cut-off capacitors 86 and 88). Nonetheless, when a bias is not applied to amplifier elements 6 and 8 from a source outside the high-frequency power amplifier, there is no need to mount the bias cut-off capacitors 76 and 78 (bias cut-off capacitors 86 and 88).

As described above, for simplification of descriptions, two pairs of a combiner and an amplifier as an example have been mainly described, no limitation thereto intended in the present invention. The present invention can also be applied to cases of other numbers of pairs for combining.

Note also that, although the configuration diagrams show a mode in which a tuned line is connected to branch lines, the present invention is not limited thereto. The configuration may be such that tuned lines and branch lines are separated from each other and are connected to each other by wires, ribbons, or the like, as necessary.

In the invention of the present application, within the scope of the invention, an arbitrary combination of two or more of the above-mentioned embodiments can be made, various changes can be made in an arbitrary component of in accordance with any one of the above-mentioned embodiments, and an arbitrary component in accordance with any one of the above-mentioned embodiments can be omitted.

INDUSTRIAL APPLICABILITY

In a high-frequency power amplifier according to the present invention, one or more tuned lines are connected between at least one terminal pair of a pair of first and second branch terminals of branch lines and a pair of first and second combining terminals of combining lines, thereby enabling reduction of a non-uniform voltage distribution occurring due to the difference in characteristics between two amplifier elements. Therefore, the high-frequency power amplifier is suitable for use in the VHF band, UHF band, microwave band, and millimeter-wave band.

EXPLANATIONS OF REFERENCE NUMERALS

1: INPUT TERMINAL, 2: BRANCH LINE, 3: BRANCH TERMINAL (FIRST BRANCH TERMINAL), 4:

BRANCH LINE, 5: BRANCH TERMINAL (SECOND BRANCH TERMINAL), 6: AMPLIFIER ELEMENT (FIRST AMPLIFIER ELEMENT) 7: COMBINING TERMINAL (FIRST COMBINING TERMINAL), 8: AMPLIFIER ELEMENT (SECOND AMPLIFIER ELEMENT) 9: COMBINING TERMINAL (SECOND COMBINING TERMINAL), 10: COMBINING LINE, 11: COMBINING LINE, 12: OUTPUT TERMINAL, 13: TUNED LINE, 14: TUNED LINE, 21: DIELECTRIC SUBSTRATE FOR A SPLITTER; 22: DIELECTRIC SUBSTRATE FOR A COMBINER, 23, 24, 25, and 26: METAL WIRE, 31: TUNED LINE, 32: LESS-THAN-½-WAVELENGTH LINE, 33 and 34: TUNED CAPACITOR, 35: TUNED LINE, 36: LESS-THAN-¼-WAVELENGTH LINE, 37 and 38: TUNED CAPACITOR, 41: TUNED LINE, 43: TUNED INDUCTOR, 43: TUNED CAPACITOR, 44: TUNED LINE, 45: TUNED INDUCTOR, 46: TUNED CAPACITOR, 51: TUNED LINE, 52 and 53: ½-WAVELENGTH LINE, 54, 55, and 56: OSCILLATION SUPPRESSION RESISTOR, 57 and 58: TUNED CAPACITOR, 61: TUNED LINE, 62 and 63: ½-WAVELENGTH LINE, 64, 65, and 66: OSCILLATION SUPPRESSION RESISTOR, 67 and 68: TUNED CAPACITOR, 71: TUNED ILINE, 72 and 74: ¼-WAVELENGTH LINE, 73: ½-WAVELENGTH LINE, 75 and 77: OSCILLATION SUPPRESSION RESISTOR, 76: BIAS CUT-OFF CAPACITOR, 81: TUNED LINE, 82 and 84: ¼-WAVELENGTH LINE, 83: ½-WAVELENGTH LINE, 85 and 87: OSCILLATION SUPPRESSION RESISTOR, and 86: BIAS CUT-OFF CAPACITOR.

The invention claimed is:

1. A high-frequency power amplifier comprising:
   branch lines that split a signal input from an input terminal into two separate signals to output a separate signal being one of the two separate signals from a first branch terminal, and to output a separate signal being another one of the two separate signals from a second branch terminal;
   a first amplifier element that amplifies the separate signal output from the first branch terminal of the branch lines;
   a second amplifier element that amplifies the separate signal output from the second branch terminal of the branch lines;
   combining lines that combine the amplified separate signal obtained by the first amplifier element and the amplified separate signal obtained by the second amplifier element, thereby to output to an output terminal a combined signal including two separate signals; and
   one or more tuned lines each being comprised of a line having a length of n times a wavelength of a fundamental wave of the signal input from the input terminal where n is a natural number, wherein
   said one or more tuned lines are connected between at least one terminal pair of a pair of the first and second branch terminals of the branch lines and a pair of first and second combining terminals of the combining lines which receive the respective amplified separate signals obtained by the first and second amplifier elements, thereby to reduce a non-uniform voltage distribution occurring between said at least one terminal pair.

2. A high-frequency power amplifier comprising:
   branch lines that split a signal input from an input terminal into two separate signals to output a separate signal being one of the two separate signals from a first branch terminal, and to output a separate signal being another one of the two separate signals from a second branch terminal;
   a first amplifier element that amplifies the separate signal output from the first branch terminal of the branch lines;
   a second amplifier element that amplifies the separate signal output from the second branch terminal of the branch lines;
   combining lines that combine the amplified separate signal obtained by the first amplifier element and the amplified separate signal obtained by the second amplifier element, thereby to output to an output terminal a combined signal including two separate signals; and
   one or more tuned lines each being comprised of a series circuit having a line and a capacitor which are connected in series with each other, the line having a length shorter than one-half a wavelength of a fundamental wave of the signal input from the input terminal, wherein
   said one or more tuned lines are connected between at least one terminal pair of a pair of the first and second branch terminals of the branch lines and a pair of first and second combining terminals of the combining lines which receive the respective amplified separate signals obtained by the first and second amplifier elements, thereby to reduce a non-uniform voltage distribution occurring between said at least one terminal pair.

3. The high-frequency power amplifier according to claim 1, wherein a resistor is loaded on said one or more tuned lines.

* * * * *